(12) United States Patent
Schlarmann et al.

(10) Patent No.: US 9,131,325 B2
(45) Date of Patent: Sep. 8, 2015

(54) MEMS DEVICE ASSEMBLY AND METHOD OF PACKAGING SAME

(75) Inventors: Mark E. Schlarmann, Austin, TX (US); Andrew C. McNeil, Austin, TX (US); Hemant D. Desai, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 548 days.

(21) Appl. No.: 13/360,920

(22) Filed: Jan. 30, 2012

(65) Prior Publication Data
US 2012/0175747 A1 Jul. 12, 2012

Related U.S. Application Data

(63) Continuation-in-part of application No. 12/873,195, filed on Aug. 31, 2010, now Pat. No. 8,304,275.

(51) Int. Cl.

| | |
|---|---|
| *H04R 23/00* | (2006.01) |
| *H01L 29/84* | (2006.01) |
| *G01L 19/00* | (2006.01) |
| *H04R 31/00* | (2006.01) |
| *B81C 1/00* | (2006.01) |
| *B81B 7/00* | (2006.01) |
| *H04R 21/02* | (2006.01) |
| *G01L 9/00* | (2006.01) |
| *G01L 19/14* | (2006.01) |

(52) U.S. Cl.
CPC .............. *H04R 31/00* (2013.01); *B81B 7/0054* (2013.01); *B81C 1/00309* (2013.01); *G01L 9/0054* (2013.01); *G01L 19/142* (2013.01); *G01L 19/148* (2013.01); *H04R 21/02* (2013.01); *B81B 2201/0264* (2013.01); *B81C 2203/0154* (2013.01); *H04R 23/006* (2013.01); *H04R 2201/003* (2013.01)

(58) Field of Classification Search
CPC .... H01L 29/84; B81B 7/0048; B81B 7/0058; B81C 1/00261; B81C 1/00301; B81C 1/00309; B81C 1/00325
USPC ....................................... 438/50–53
See application file for complete search history.

(56) References Cited

U.S. PATENT DOCUMENTS

| | | | |
|---|---|---|---|
| 6,925,875 | B2 | 8/2005 | Silverbrook |
| 7,475,597 | B2 | 1/2009 | Brida et al. |

(Continued)

FOREIGN PATENT DOCUMENTS

| | | |
|---|---|---|
| CN | 101329361 | 6/2011 |
| EP | 1561724 A1 | 10/2005 |

*Primary Examiner* — Matthew W Such
*Assistant Examiner* — Scott Stowe

(57) ABSTRACT

An assembly (220) includes a MEMS die (222) and an integrated circuit (IC) die (224) attached to a substrate (226). The MEMS die (222) includes a MEMS device (237) formed on a substrate (242). A packaging process (264) entails forming the MEMS device (237) on the substrate (242) and removing a material portion of the substrate (237) surrounding the device (237) to form a cantilevered substrate platform (246) suspended above the substrate (226) at which the MEMS device (237) resides. The MEMS die (222) is electrically interconnected with the IC die (224). A plug element (314) can be positioned overlying the platform (246). Molding compound (32) is applied to encapsulate the die (222), the IC die (224), and substrate (226). Following encapsulation, the plug element (314) can be removed, and a cap (236) can be coupled to the substrate (242) overlying an active region (244) of the MEMS device (237).

6 Claims, 19 Drawing Sheets

(56) References Cited

U.S. PATENT DOCUMENTS

| | | |
|---|---|---|
| 7,661,318 B2 | 2/2010 | Brosh et al. |
| 8,072,081 B2 | 12/2011 | Wang |
| 2008/0022777 A1 | 1/2008 | Tan et al. |
| 2008/0236292 A1 | 10/2008 | Reijs |
| 2008/0290430 A1 | 11/2008 | Mahadevan |
| 2008/0314723 A1 | 12/2008 | Liu |
| 2009/0311819 A1* | 12/2009 | Chang et al. .......... 438/51 |
| 2010/0109103 A1 | 5/2010 | Tsao |
| 2011/0159627 A1 | 6/2011 | Mantravadi et al. |

* cited by examiner

FIG. 4
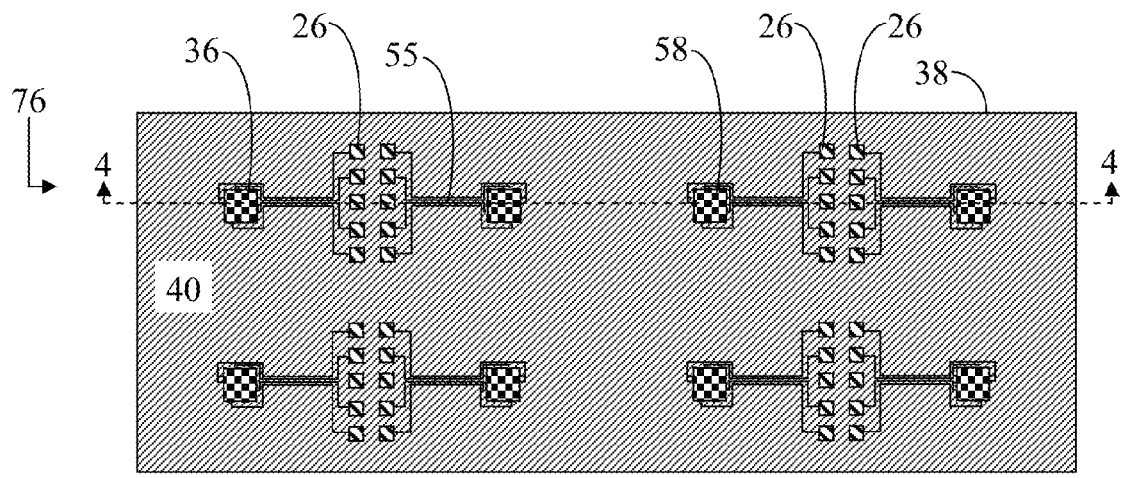
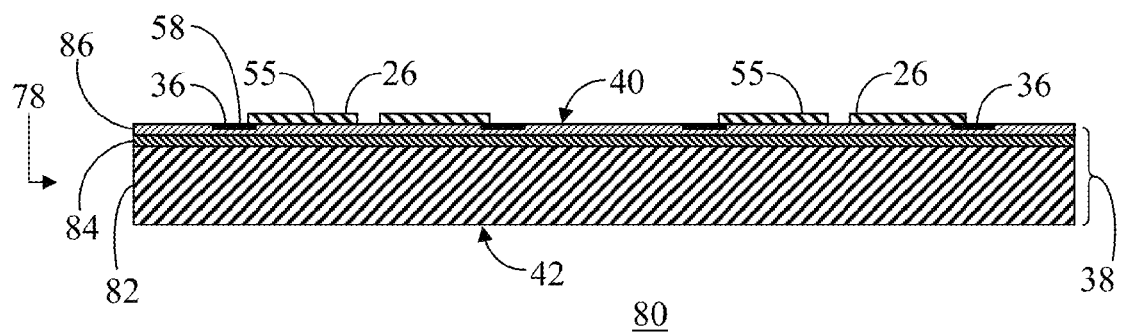
FIG. 5
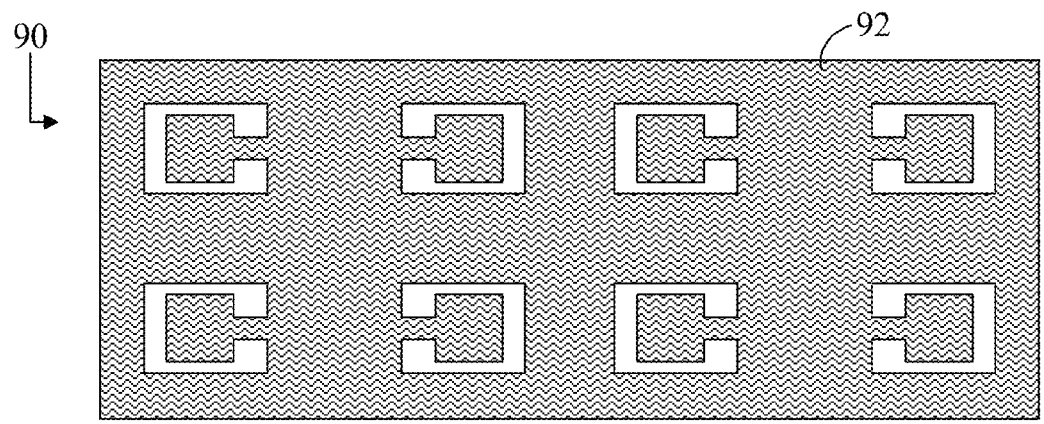

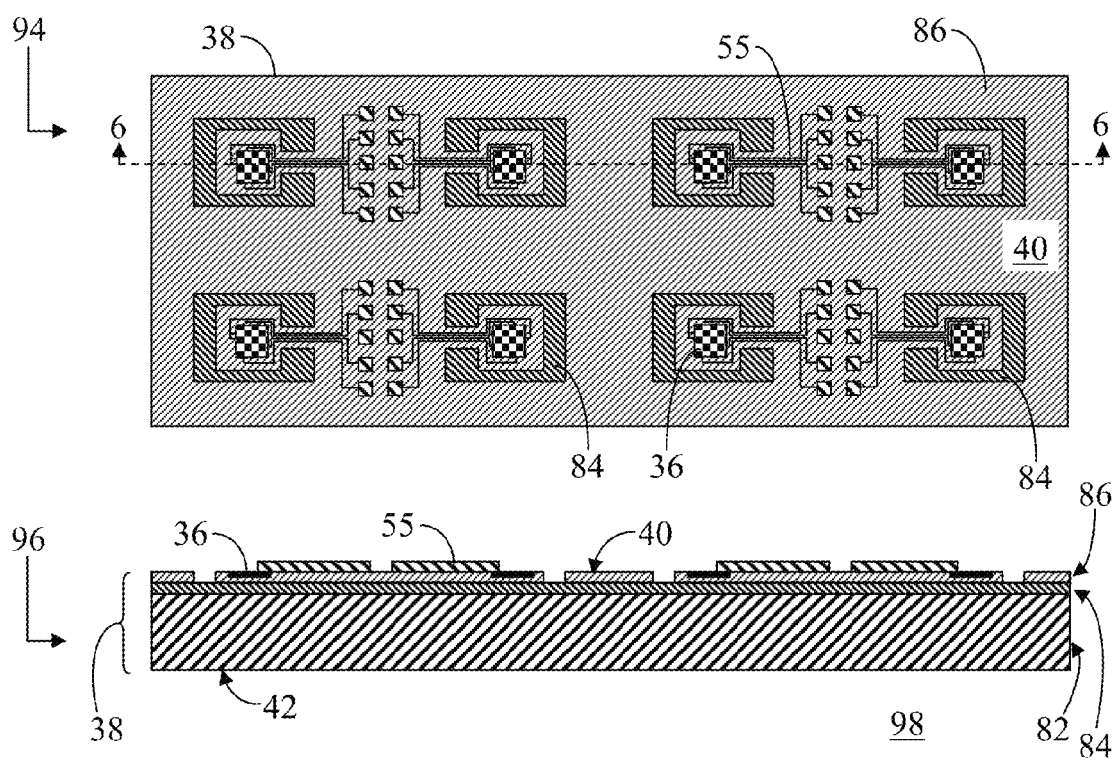
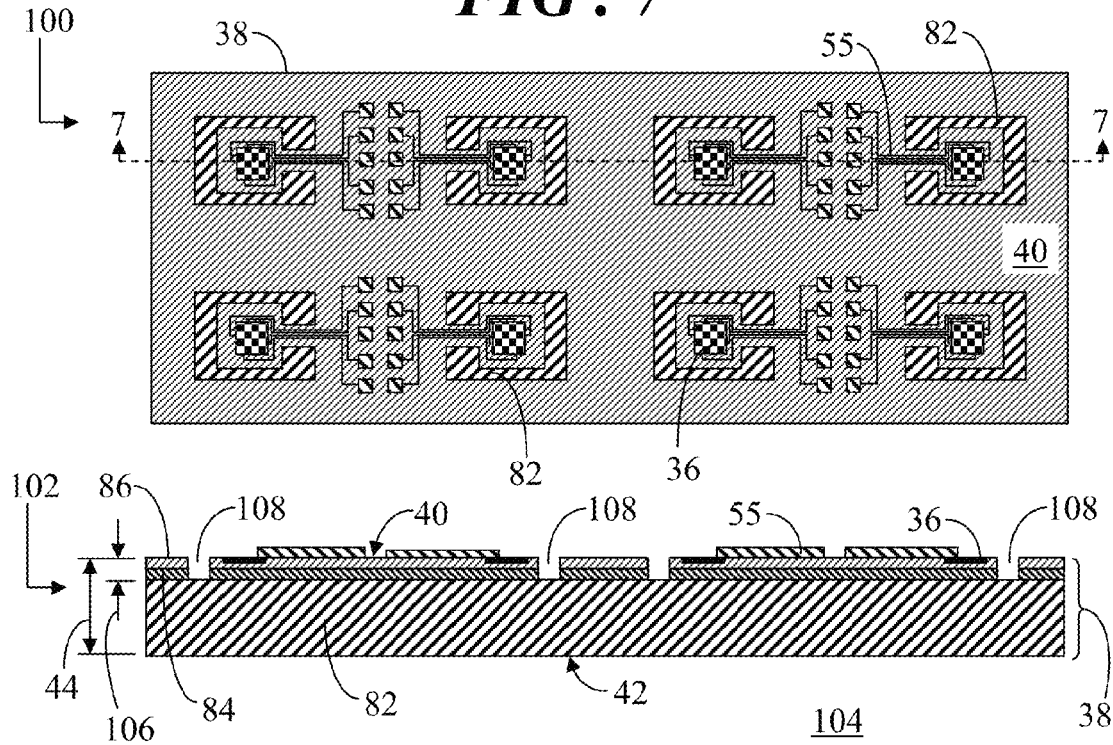

FIG. 8
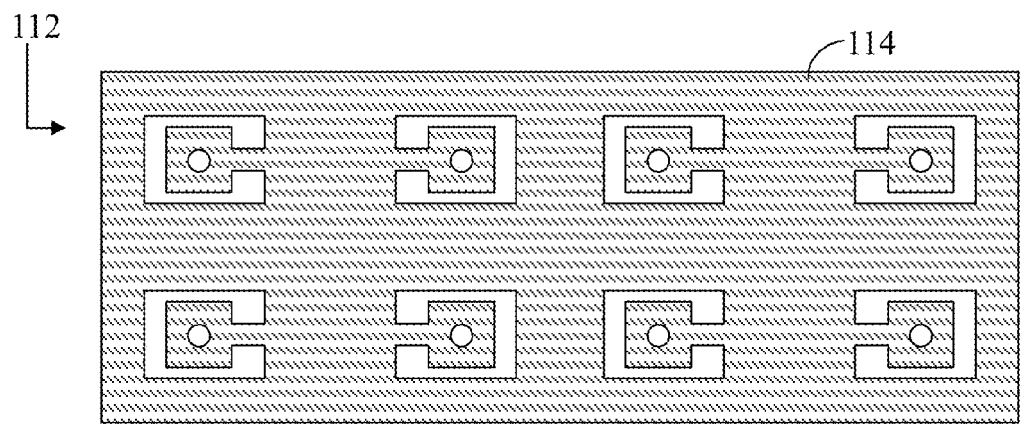
FIG. 9
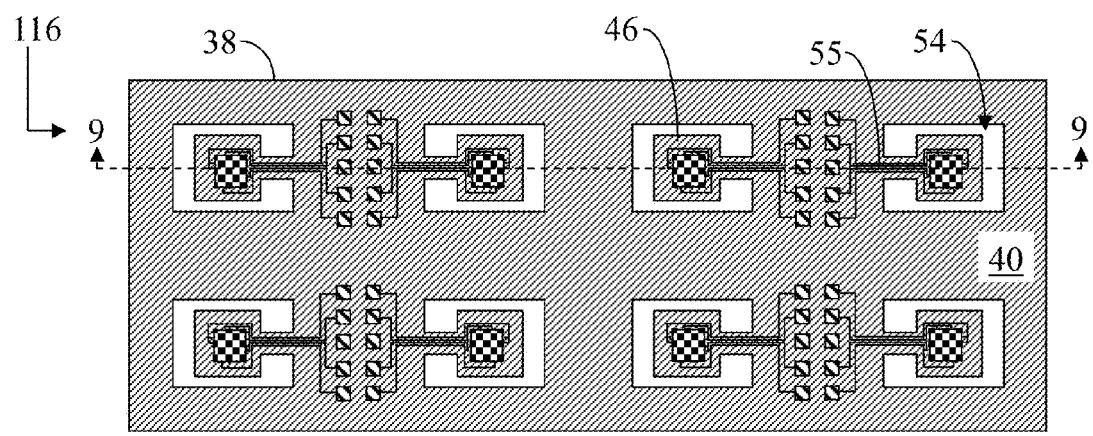
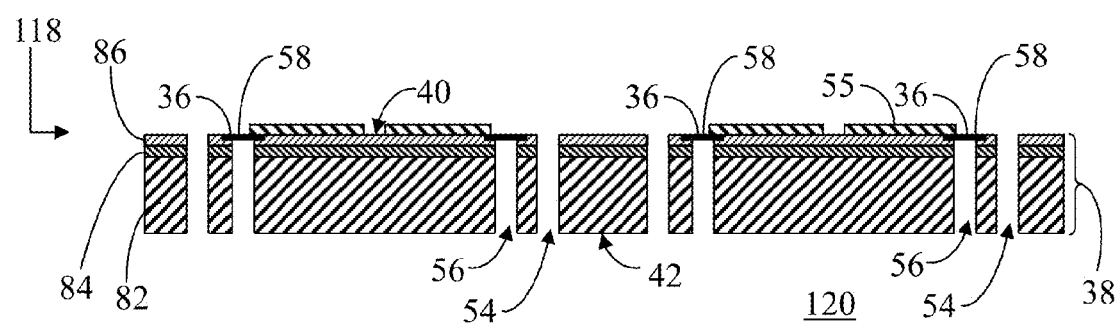

FIG. 15
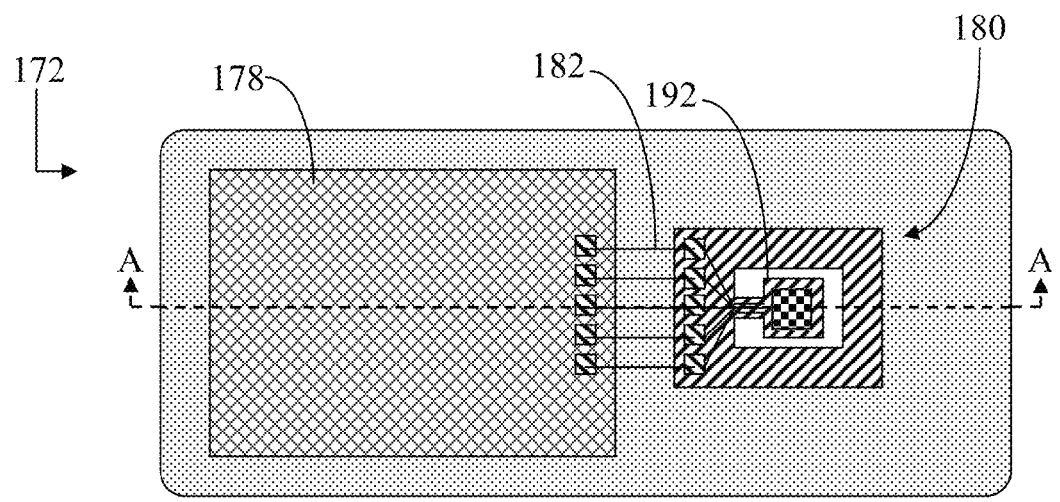
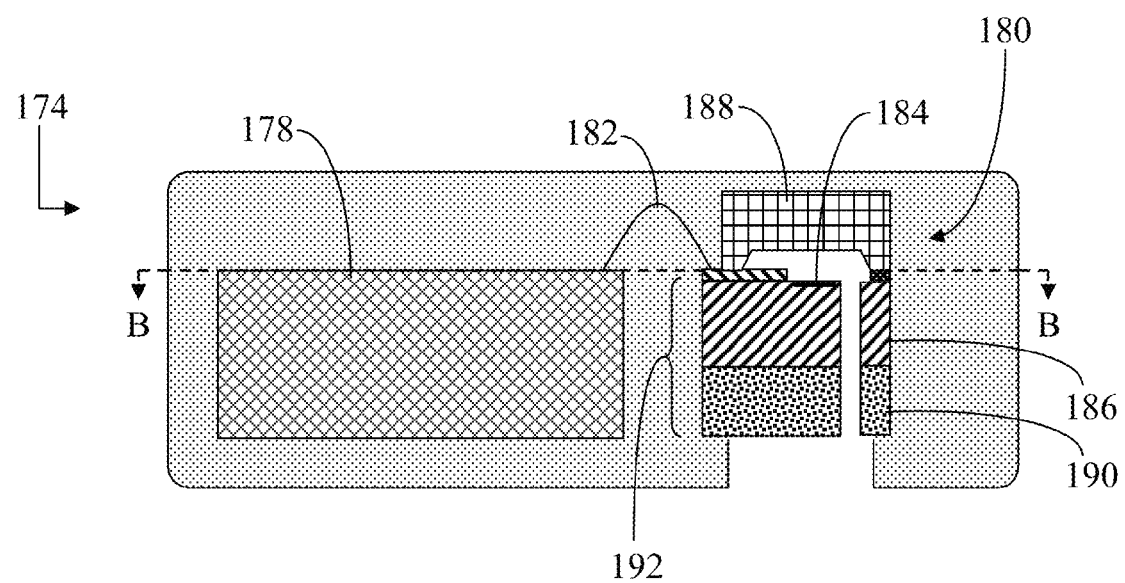

FIG. 22
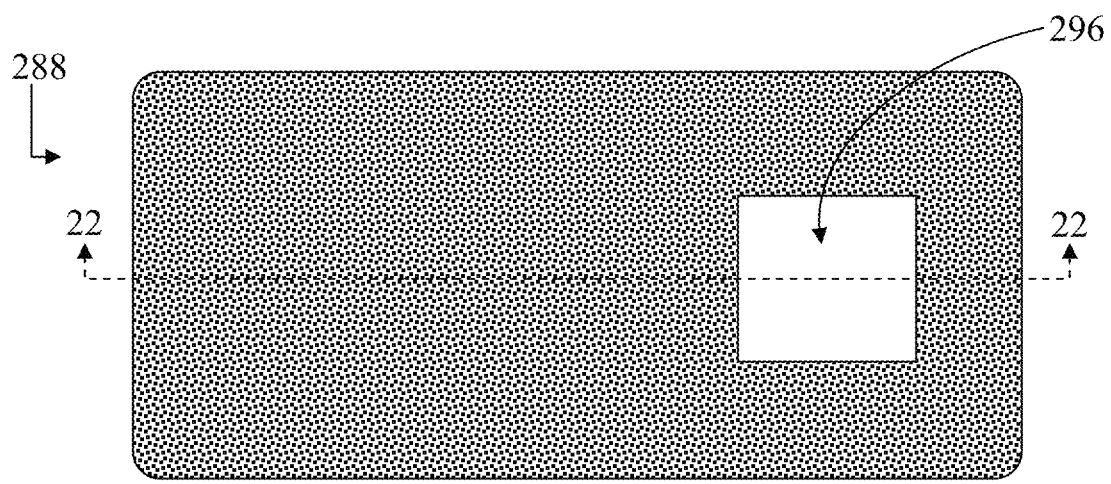
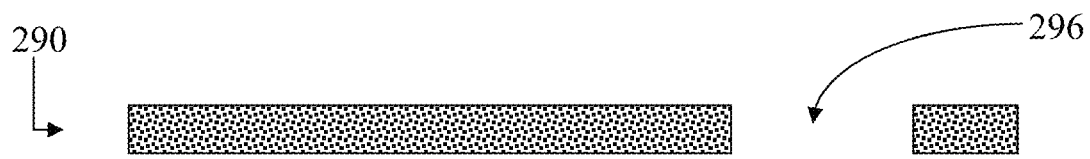
292
FIG. 23
294

MEMS DEVICE ASSEMBLY AND METHOD OF PACKAGING SAME

RELATED INVENTION

The present invention is a continuation in part (CIP) of "MEMS Device Assembly and Method of Packaging Same," U.S. patent application Ser. No. 12/873,195, filed 31 Aug. 2010 now U.S. Pat. No. 8,304,275, which is incorporated by reference herein.

TECHNICAL FIELD OF THE INVENTION

The present invention relates generally to microelectromechanical systems (MEMS) device assemblies. More specifically, the present invention relates to MEMS device assemblies and method of packaging for improved stress isolation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

There are significant challenges to be surmounted in the packaging of MEMS devices due at least in part to the necessity for the MEMS devices to interact with the outside environment, the fragility of many types of MEMS devices, and severe cost constraints. Indeed, many MEMS device applications require smaller size and low cost packaging to meet aggressive cost targets. The packaging of MEMS sensor applications often uses materials with dissimilar coefficients of thermal expansion. As such, a high thermally induced stress can develop during MEMS device manufacture or operation. These thermal stresses, as well as stresses due to moisture and assembly processes, can result in deformation of the underlying substrate, referred to herein as package stress. Variations in package stress can cause instability of the MEMS device and output shifts in the MEMS device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4 shows a top view and a side sectional view of a partial MEMS wafer at an initial stage of processing;

FIG. 5 shows a top view of a mask used at a subsequent stage of processing;

FIG. 6 shows a top view and a side sectional view of the structure of FIG. 4 at a subsequent stage of processing;

FIG. 7 shows a top view and a side sectional view of the structure of FIG. 6 at a subsequent stage of processing;

FIG. 8 shows a top view of a mask used at a subsequent stage of processing;

FIG. 9 shows a top view and a side sectional view of the structure of FIG. 7 at a subsequent stage of processing;

FIG. 15 shows a top view and a side sectional view of a MEMS chip in accordance with another embodiment;

FIG. 22 shows a top view and a side sectional view of a base substrate for the MEMS chip of FIGS. 17 and 18;

FIG. 23 shows a side view of a base substrate for the MEMS chip of FIGS. 17 and 18 in accordance with another embodiment;

DETAILED DESCRIPTION

As the uses for MEMS devices continue to grow and diversify, increasing emphasis is being placed on smaller size and low cost packaging without sacrificing part performance. Another continuing challenge in MEMS device packaging is providing environmental protection for the fragile moving parts of a MEMS device that does not affect the mechanical motion of these moving parts. Embodiments entail microelectromechanical systems (MEMS) device assemblies and a method of packaging such MEMS device assemblies for improved stress isolation. In particular, MEMS devices are created through the execution of relatively simple methodology as cantilevered structures that provide improved package stress isolation. The methodology additionally allows for the use of low-cost overmolded packaging that provides the appropriate environmental protection of the MEMS devices without affecting the mechanical motion of the moving parts of the MEMS devices.

Figure 1:
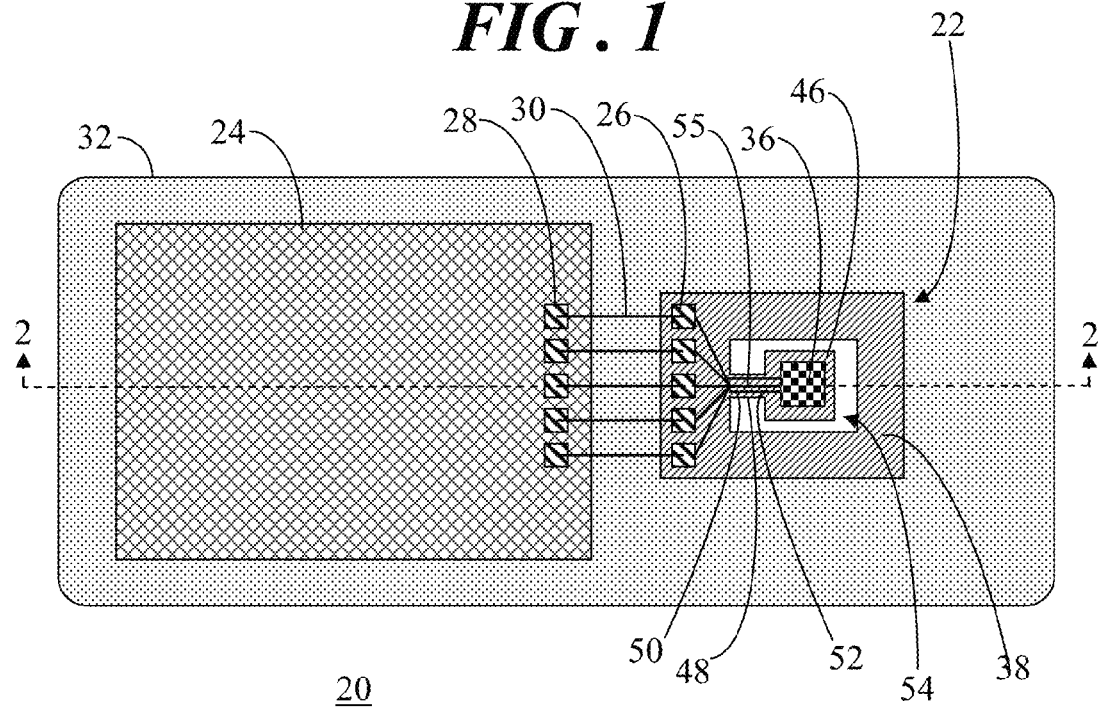
FIG. 1 shows a top view of a microelectromechanical systems (MEMS) chip in accordance with an embodiment.
Figure 2:
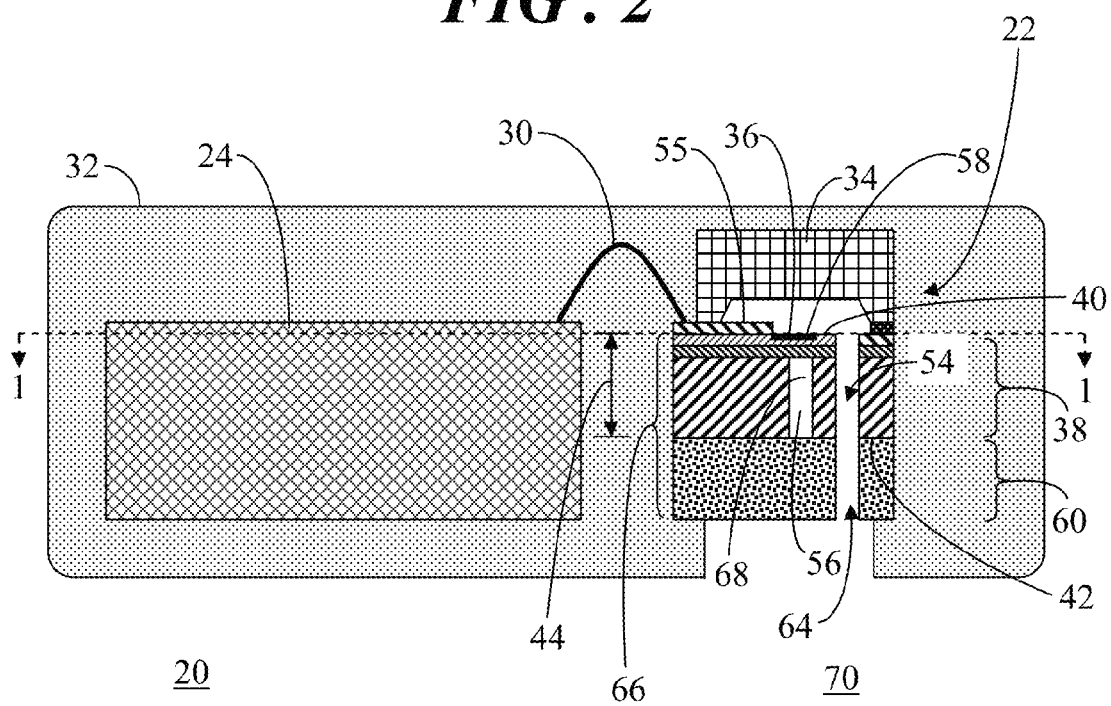
FIG. 2 shows a side sectional view of the MEMS chip.

Referring now to FIGS. 1 and 2, FIG. 1 shows a top view of a microelectromechanical systems (MEMS) chip 20 in accordance with an embodiment, and FIG. 2 shows a side sectional view of MEMS chip 20. The top view of MEMS chip 20 shown in FIG. 1 is taken along section lines 1-1 of FIG. 2, and the side sectional view of MEMS chip 20 shown in FIG. 2 is taken along section lines 2-2 of FIG. 1. FIGS. 1-2 and subsequent FIGS. 3-16 are illustrated using various shading and/or hatching to distinguish the different elements of MEMS chip 20, as will be discussed below. These different elements within the structural layers may be produced utilizing current and upcoming micromachining techniques of depositing, patterning, etching, and so forth.

MEMS chip 20 is a MEMS device assembly that includes a MEMS die 22 and an integrated circuit die 24. MEMS die 22 has bondwire pads 26. Similarly, integrated circuit die 24 has bondwire pads 28. MEMS die 22 and integrated circuit die 24 are electrically interconnected via conductive interconnects 30 spanning between bondwire pads 26 and bondwire pads 28. MEMS die 22, integrated circuit die 24, bondwire pads 26, bondwire pads 28, and conductive interconnects 30 are overmolded with a molding compound 32. That is, molding compound 32 substantially encapsulates MEMS die 22, integrated circuit die 24, bondwire pads 26, bondwire pads 28, and conductive interconnects 30. However, MEMS die 22 is a MEMS package that includes a cap layer 34 overlying a MEMS device 36. Cap layer 34 prevents molding compound 32 from contacting the underlying MEMS device 36.

MEMS die 22 further includes a first substrate 38 having a front side 40 and a back side 42 separated from front side 40 by a substrate thickness 44. MEMS device 36 is formed on, or alternatively, in front side 40 of first substrate 38. A material portion of first substrate 38 is removed surrounding MEMS device 36 to form a cantilevered substrate platform 46 at which MEMS device 36 resides. Cantilevered substrate platform 46 includes an arm 48 extending from platform 46. A first end 50 of arm 48 is fixed to first substrate 38, and a second end 52 of arm 48 is fixed to substrate platform 46. Thus, once the material portion of first substrate 38 is removed, an opening 54 extends through substrate thickness 44 of first substrate 38 and partially surrounds cantilevered substrate platform 46, with first end 50 of arm 48 being the sole attachment point of cantilevered substrate platform 46 to the surrounding first substrate 38. In addition, conductive traces 55 may be formed on arm 48. Traces 55 electrically couple bondwire pads 26 with MEMS device 36 residing on cantilevered substrate platform 46. The terms "first" and "second" used herein do not refer to an ordering or prioritization of elements within a countable series of elements. Rather, the terms "first" and "second" are used to distinguish the particular elements for clarity of discussion.

In the illustrated embodiment, first substrate 38 includes an aperture 56 extending from back side 42 of first substrate 38 to an active region 58 of MEMS device 36. MEMS device 36 further includes a second substrate 60 attached to back side 42 of first substrate 38. A material portion of second substrate 60 is removed from second substrate 60 to form another cantilevered substrate platform 62, best seen in FIG. 10. Once the material portion of second substrate 60 is removed, an opening 64 extends through second substrate 60, and partially surrounds cantilevered substrate platform 62

Second substrate 60 is attached to back side 42 of first substrate 38 so that cantilevered substrate platform 62 (FIG. 10) is vertically stacked with cantilevered substrate platform 46 of first substrate 38 to form a stacked cantilevered platform structure 66. In this configuration, platform 62 of second substrate 60 covers aperture 56 to form a sealed cavity 68 underlying active region 58 of MEMS device. Openings 54 and 64 in respective substrates 38 and 60 serve as a port so that active region 58 of MEMS device 36 is exposed to an environment 70 external to MEMS chip 20. In alternative embodiments, second substrate 60 may not be required (discussed below). In still other embodiments, MEMS devices may not require a port to environment 70. As such, substrate 60 may serve as a seal or cap (also discussed below).

MEMS device 36 may be configured to sense a pressure stimulus from environment 70 external to MEMS chip 20. Active region 58 is exposed to external environment 70 via aligned openings 54 and 64 extending through respective substrates 38 and 60. In an exemplary embodiment, MEMS device 36 may be a piezoresistive type pressure sensor. Piezoresistive pressure sensors sense external pressure by means of a piezoresistance effect of a silicon diaphragm as the pressure detecting device. For example, piezoresistive materials (not shown) may be deposited on, diffused into, or otherwise formed on or into front side 40 of first substrate 38 at active region 58, which serves as a movable diaphragm. The piezoresistive elements are typically realized as diffused resistors, and these diffusion resistors are typically connected into a bridge circuit. The pressure signal is taken out from the bridge circuit in accordance with changes in the resistance values of the diffusion resistors which are caused by displacement of the diaphragm, e.g. active region 58.

Although in certain embodiments, MEMS device 36 may be a piezoresistive pressure sensor and active region 58 may be a movable diaphragm, it should be understood that MEMS device 36 represents a variety of one or more MEMS components of MEMS chip 20, such as microswitches and/or microsensors. Microsensors include, for example, pressure sensors, accelerometers, gyroscopes, microphones, micro fluidic devices, and so forth. Accordingly, active region 58 represents any sensing, or movable, element of a particular MEMS component. Integrated circuit die 24 represents the central unit, e.g., a microprocessor, that processes data from MEMS device 36. Thus, integrated circuit die 24 provides "intelligence" built into MEMS chip 20. Although MEMS chip 20 is shown as including only one MEMS device 36 and one integrated circuit die 24, it should be understood that MEMS chip 20 can include any number of MEMS dice 22 and integrated circuit dice 24 in accordance with particular design requirements for MEMS chip 20.

In general, MEMS die 22 is fabricated in accordance with wafer-level packaging methodology that achieves improved package stress isolation of MEMS device 36. MEMS die 22 and integrated circuit die 24 are interconnected via conductive interconnects 30, and the resulting structure is encapsulated in molding compound 32 as discussed in the ensuing methodology.

Figure 3:
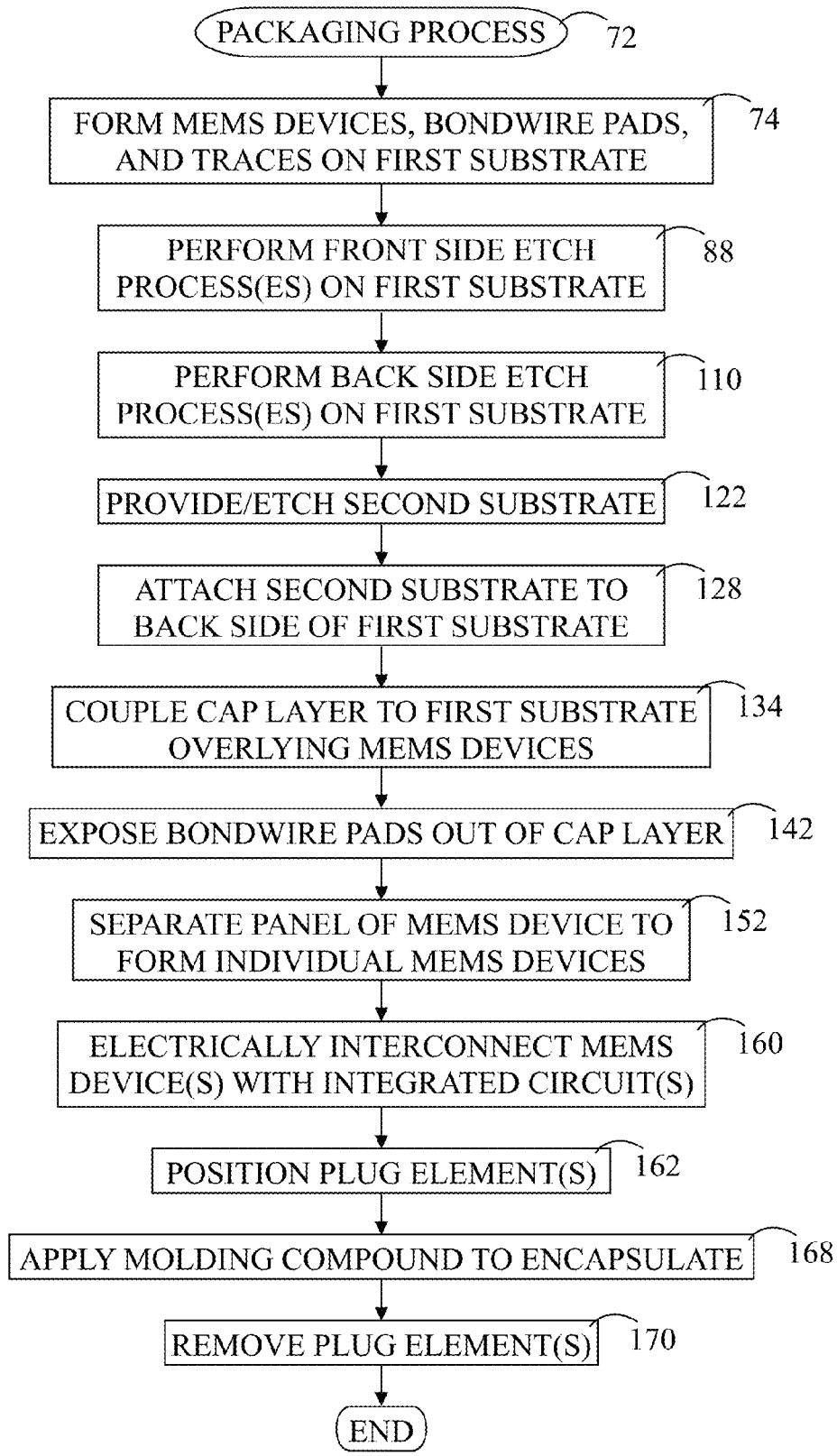
FIG. 3 shows a flowchart of a packaging process for producing and packaging the MEMS chip of FIGS. 1 and 2 in accordance with another embodiment.

FIG. 3 shows a flowchart of a packaging process 72 for producing and packaging MEMS chip 20 (FIGS. 1 and 2) in accordance with another embodiment. Process 72 implements known and developing MEMS micromachining technologies to cost effectively yield MEMS chip 20 that includes at least one MEMS die 22 having improved package stress isolation. Although a single process is shown in which MEMS chip 20 is produced and packaged, it should be understood that multiple entities may execute certain operations of process 72. By way of example, one manufacturer may produce MEMS die 22 and another manufacturer may subsequently package MEMS die 22 to yield MEMS chip 20. Process 72 is described below in connection with the fabrication and packaging of only a few MEMS dice 22 and a few MEMS chips 20. However, it should be understood by those skilled in the art that the following process allows for concurrent wafer-level manufacturing of a plurality of MEMS dice 22. These individual MEMS dice 22 can subsequently be packaged and integrated into an end application that includes integrated circuit die 24.

MEMS chip packaging process 72 begins with a task 74. At task 74, fabrication processes related to the formation of MEMS devices 36, bondwire pads 26, and traces 55 are performed.

Referring to FIG. 4 in connection with task 74, FIG. 4 shows a top view 76 and a side sectional view 78 of a partial wafer at an initial stage of processing 80 to produce MEMS chip 20 (FIG. 1). Side sectional view 78 is taken along section lines 4-4 of top view 76. In an embodiment, fabrication processes may implement silicon on insulator technology (SOI). SOI technology refers to the use of a silicon-insulator-silicon substrate in lieu of conventional silicon substrates. SOI-based devices differ from conventional silicon-built devices in that the silicon junction is above an electrical insulator, typically silicon dioxide. In MEMS devices, SOI wafers may be used to fabricate piezoresistive pressure sensors because the thin silicon junction, or layer, can be used to form a diaphragm of the pressure sensor that is able to bow when pressure is applied. For other MEMS sensor configurations, the thin silicon junction may be used to form the active (moving) part of the sensor.

As shown, first substrate 38 is an SOI-based wafer having a silicon (e.g., single crystal silicon) base layer 82, a silicon dioxide insulating layer 84, and a silicon (e.g., polysilicon) top layer 86. Fabrication processes may entail the diffusion, or implantation, of piezoresistive materials (not shown) into front side 40 of first substrate 38, and in particular into silicon top layer 86, to form active regions 58 of MEMS devices 36 having diffusion resistors. Next, metal deposition, patterning, and etching may be performed to form bondwire pads 26 and traces 55. Traces 55 may at least partially overly the diffusion resistors to form suitable electrical connections. Other fabrication activities may be performed per convention that are not discussed or illustrated herein for clarity of description.

With reference back to FIG. 3, packaging process continues with a task 88. At task 88, one or more front side etch processes are performed on first substrate 38.

Referring to FIGS. 5-7 in connection with task 88, FIG. 5 shows a top view 90 of a mask 92 used in connection with a subsequent stage of processing represented by task 88. FIG. 6 shows a top view 94 and a side sectional view 96 of structure of FIG. 4 at a subsequent stage of processing 98, and FIG. 7 shows a top view 100 and a side sectional view 102 of the structure of FIG. 6 at a subsequent stage of processing 104. Side sectional view 96 is taken along section lines 6-6 of top view 94 in FIG. 6. Similarly, side sectional view 102 is taken along section lines 7-7 of top view 100 in FIG. 7.

Task 88 relates to one or more etch processes performed from front side 40 of first substrate 38 toward back side 42 of first substrate 38. Mask 92 is used to cover or otherwise protect those regions of front side 40 that are not to be etched. As such, mask 92 provides a pattern for forming openings 54 (FIG. 1) through first substrate 38 and for producing cantilevered substrate platform 46 (FIG. 1). Mask 92 is shown as a separate element for illustrative purposes. However, in an embodiment, mask 92 may be formed by depositing a resist material on front side 40 and appropriately patterning the resist material to produce the pattern of mask 92 on front side 40. FIG. 6 represents the outcome of a first front side removal, i.e., etching, process that removes a material portion of silicon top layer 86 so that the underlying silicon dioxide insulating layer 84 is exposed. FIG. 7 represents the outcome of a second front side removal, i.e., etching, process that removes a material portion of silicon dioxide insulating layer 84 so that the underlying silicon base layer 82 is exposed.

The first and second front side removal processes may be performed using any of a number of known and upcoming etching processes, such as a Deep Reactive Ion Etch (DRIE) technique, a Potassium Hydroxide (KOH) etch technique, or any suitable techniques, so that a thickness 106 of a section 108 removed of the total material portion of first substrate 38 to be removed is less than thickness 44 of first substrate 38.

With reference back to FIG. 3, following task 88, packaging process 72 continues with a task 110. At task 110, one or more back side etch processes are performed on first substrate 38.

Referring to FIGS. 8 and 9 in connection with task 110, FIG. 8 shows a top view 112 of a mask 114 used at a subsequent stage of processing represented by task 110, and FIG. 9 shows a top view 116 and a side sectional view 118 of the structure of FIG. 7 at a subsequent stage of processing 120. Side sectional view 118 is taken along section lines 9-9 of top view 116 in FIG. 9.

Task 110 relates to one or more etch processes performed from back side 42 of first substrate 38 toward front side 40 of first substrate 38. Mask 114 is used to cover or otherwise protect those regions of back side 42 that are not to be removed. As such, mask 114 provides a pattern for forming openings 54 (FIG. 1) through first substrate 38 so as to produce cantilevered substrate platform 46 (FIG. 1). In addition, mask 114 provides a pattern for forming apertures 56 through substrate 38 underlying active regions 58 of MEMS devices 36.

FIG. 9 represents the outcome of a back side removal, i.e., etching, process performed at task 110 that removes the remainder of the material portion of first substrate 38 to form openings 54 extending through an entirety of first substrate 38 and thereby produce cantilevered substrate platform 46. In addition, the back side removal processes concurrently removes another material portion of first substrate 38 to produce apertures 56 extending through first substrate 38 to active regions 58. The back side removal processes may be performed using any of a number of known and upcoming etching processes, such as a Deep Reactive Ion Etch (DRIE) technique, a Potassium Hydroxide (KOH) etch technique, or any other suitable technique. It should be noted that some MEMS device embodiments may not call for apertures 56. Accordingly, openings 54 in first substrate 38 to produce cantilevered substrate platform 46 may be formed by implementing only a front side etch process or, alternatively, a back side etch process.

With reference back to FIG. 3, following task 110, packaging process 72 continues with a task 122. At task 122, second substrate 60 is provided and/or etched.

Figure 10:
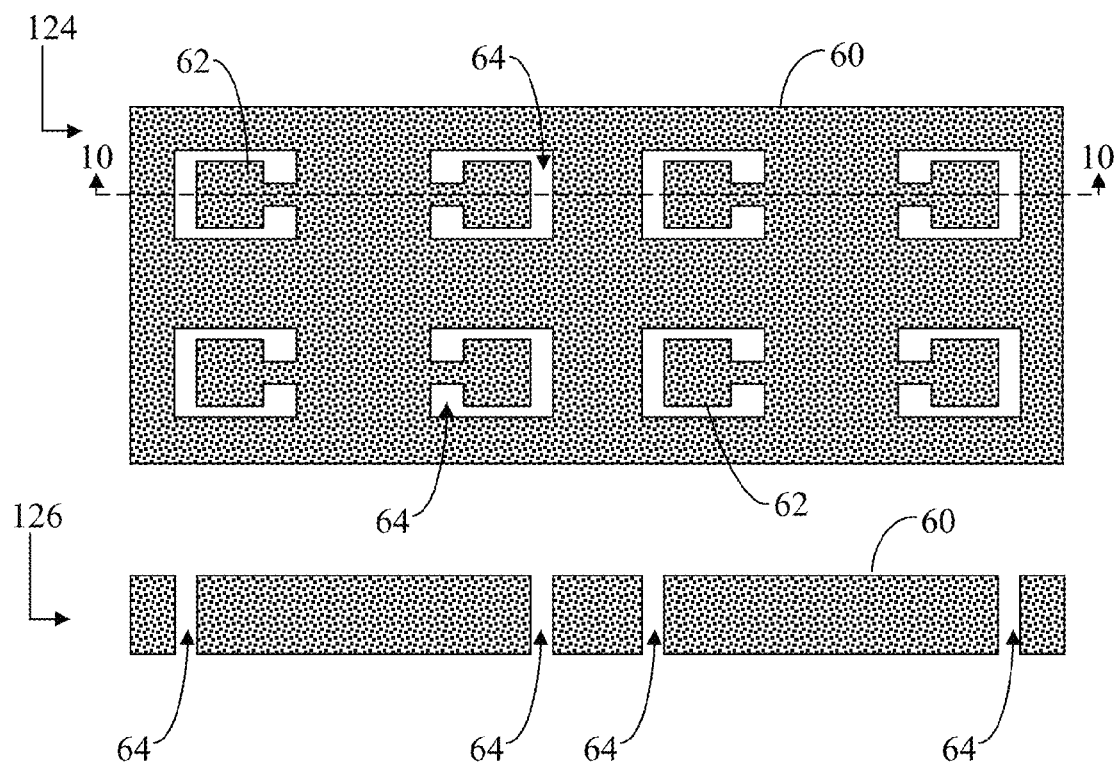
FIG. 10 shows a top view and a side sectional view of a second substrate used to form the MEMS chip of FIG. 1.

Referring now to FIG. 10 in connection with task 122, FIG. 10 shows a top view 124 and a side sectional view 126 of second substrate 60 used to form MEMS chip 20 (FIG. 1). Side sectional view 126 is taken along section lines 10-10 of top view 124 in FIG. 10. Second substrate 60 may be a wafer supplied by an outside provider with openings 64 already formed therein to produce cantilevered substrate platforms 62. Alternatively, second substrate 60 may be a wafer supplied by an outside provider that is subsequently etched or otherwise processed to form openings 64 at least partially surrounding cantilevered substrate platforms 62.

With reference back to FIG. 3, following task 122, packaging process 72 continues with a task 128. At task 128, second substrate 60 is attached to back side 42 of first substrate 38.

Figure 11:
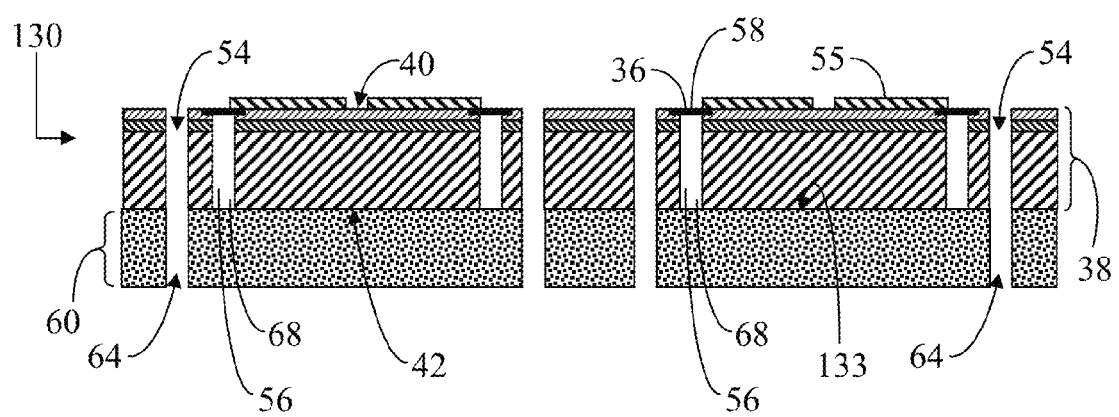
FIG. 11 shows a side view of the structure of FIG. 9 at a subsequent stage of processing.

Referring to FIG. 11 in connection with task 122, FIG. 11 shows a side sectional view 130 of the structure of FIG. 9 at a subsequent stage of processing 132. FIG. 11 represents the outcome of attaching task 128 of process 72.

As shown, a front side 133 of second substrate 60 has been attached to back side 42 of first substrate 38 such that openings 54 and 64 of first and second substrates 38 and 60, respectively, are aligned, and so that cantilevered substrate platforms 46 and 62 are vertically stacked to form stacked cantilevered platform structure 66 (FIG. 2). In this configuration, cantilevered substrate platforms 62 (FIG. 10) of second substrate 60 covers apertures 56 to yield sealed cavities 68. Second substrate 60 may be attached to first substrate 38 using any suitable attachment process and material known to those skilled in the art (e.g., glass frit bonding, silicon fusion bonding, metal eutectic bonding, anodic bonding, thermal compression bonding, and so forth). It should be noted that in those MEMS device embodiments that do not call for apertures 56 and sealed cavities 68, the inclusion of second substrate 60 in MEMS die 22 (FIG. 1) may not be required. Still other embodiments may call for a modified version of substrate 60.

With reference back to FIG. 3, following task 128, packaging process 72 continues with a task 134. At task 134, cap layer 34 is coupled to first substrate 38 overlying MEMS devices 36.

Figure 12:
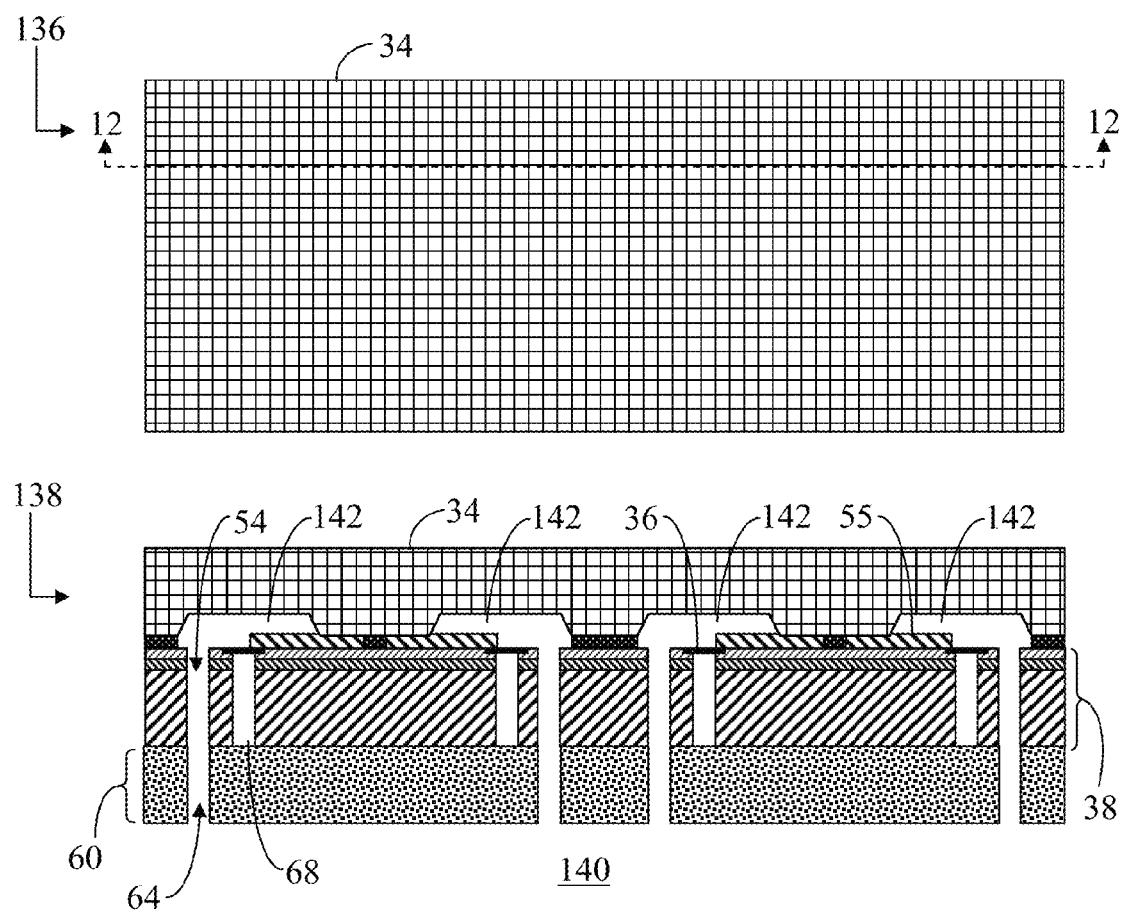
FIG. 12 shows a top view and a side sectional view of the structure of FIG. 11 at a subsequent stage of processing.

Referring to FIG. 12 in connection with task 134, FIG. 12 shows a top view 136 and a side sectional view 138 of the structure of FIG. 11 at a subsequent stage of processing 140. Side sectional view 138 is taken along section lines 12-12 of top view 136 in FIG. 12. In an embodiment, cap layer 34 may be a wafer structure that has been appropriately etched, machined, or otherwise processed to include cavities 142. Cap layer 34 provides protection for MEMS devices 36 during subsequent stages of processing and during operation, and cavities 142 provide suitable free space for MEMS devices 36 so that the inner walls of cap layer 34 do not come into contact with any moving parts of MEMS device 36. Although not shown, cap layer 34 may additionally include cavities over bondwire pads 26 (FIG. 1) so that inner walls of cap layer 34 do not come into contact with bondwire pads 26. The coupling of cap layer 34 to first substrate structure 38 may be accomplished using, for example, glass frit bonding, metal eutectic bonding, and the like.

With reference back to FIG. 3, following task 134, process 72 continues with a task 142. At task 142, bondwire pads 26 are exposed out of cap layer 34.

Figure 13:
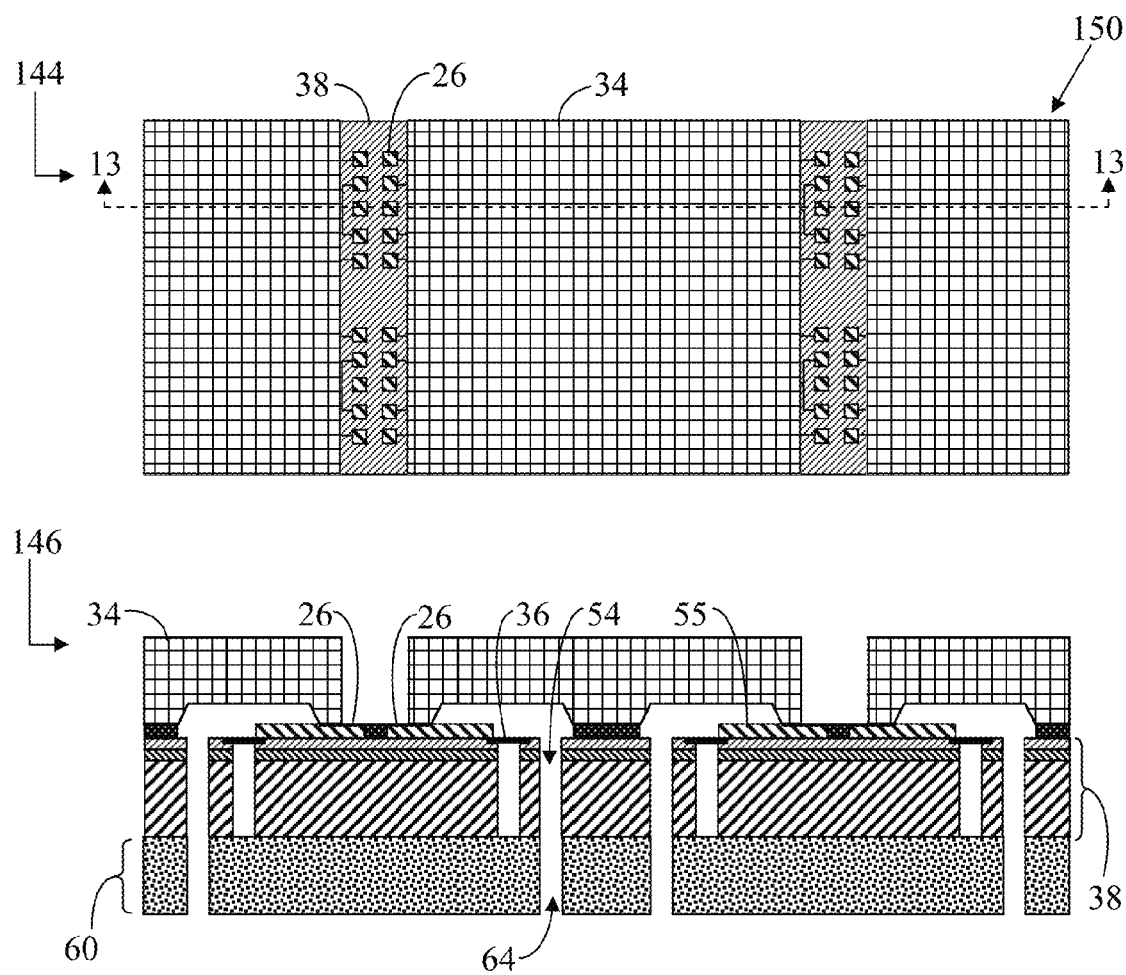
FIG. 13 shows a top view and a side sectional view of the structure of FIG. 12 at a subsequent stage of processing.

Referring to FIG. 13 in connection with task 142, FIG. 13 shows a top view 144 and a side sectional view 146 of the structure of FIG. 12 at a subsequent stage of processing 148. Side sectional view 146 is taken along section lines 13-13 of top view 144 in FIG. 13. In an embodiment, a portion of cap layer 34 is sawn, etched, or otherwise removed to reveal bondwire pads 26. Through execution of the aforementioned tasks, a panel 150 of MEMS dice 22, each including at least one MEMS device 36 is produced.

Now referring back to FIG. 3, following task 142, packaging process 72 continues with a task 152. At task 152, panel 150 of MEMS dice 22 is separated to form individual MEMS dice 22, each including at least one MEMS device 36.

Figure 14:
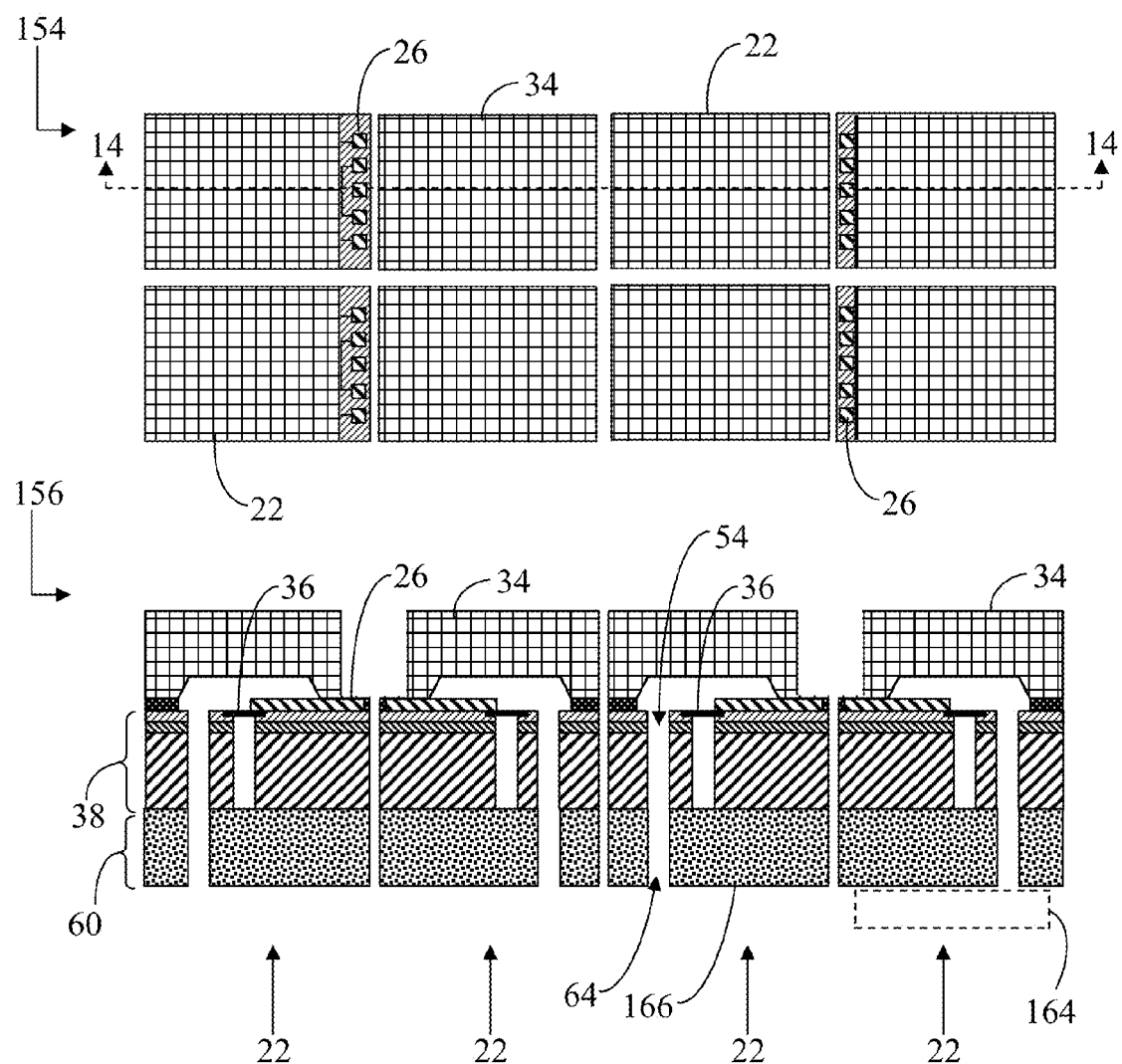
FIG. 14 shows a top view and a side sectional view of the structure of FIG. 13 at a subsequent stage of processing.

Referring to FIG. 14 in connection with task 152, FIG. 14 shows a top view 154 and a side sectional view 156 of the structure of FIG. 13 at a subsequent stage of processing 158. Side sectional view 156 is taken along section lines 14-14 of top view 154 in FIG. 14. FIG. 14 represents the outcome of a panel separation process performed at task 152. As shown, panel 150 (FIG. 13) has been sawn, diced, or otherwise separated to form individual MEMS dice 22, each of which includes at least one MEMS device 36 protected by cap layer 34.

With reference back to FIG. 3, packaging process 72 continues with a task 160. At task 160, each MEMS die 22 (FIG. 1) is electrically interconnected with its integrated circuit die 24 (FIG. 1) via conductive interconnects 30 (FIG. 1). For example, a wirebonding process may be performed to form external connections between bondwire pads 26 of MEMS die 22 and bondwire pads 28 of integrated circuit die 24 using conductive interconnects 30, as illustrated in FIG. 1.

Following task 160, a task 162 is performed. It will be recalled that MEMS chip 20 (FIG. 1) is encapsulated in molding compound 32. However, aligned openings 64 and 54 cannot be filled with or blocked by molding compound. Accordingly, at task 162 a plug element is positioned at a back side of second substrate 60 to block opening 64, and consequently opening 54. Referring briefly to FIG. 14, a plug element 164 is shown in ghost form against a back side 166 of second substrate 60 of one MEMS die 22. Plug element 164 may be tape, a portion of a lead frame, or any other element that blocks opening 64. It should be understood that plug element 164 is shown in FIG. 14 for illustrative purposes. In actual use, plug element 164 may be appropriately positioned to block opening 64 after bondwire pads 26 (FIG. 1) of MEMS die 22 have already been interconnected with bondwire pads 28 (FIG. 1) of integrated circuit die 24.

Following task 162, a task 168 is performed. At task 168, molding compound 32 is applied to MEMS die 22 with its attached integrated circuit die 24. Molding compound 32 substantially encapsulates MEMS die 22, integrated circuit die 24, bondwire pads 26 and 28, and conductive interconnects 30. However, cap layer 34 of MEMS die 22 overlying MEMS device 36 prevents molding compound 32 from direct contact with MEMS device 36. In addition, plug element 164 (FIG. 14) blocking opening 64 prevents the flow of molding compound 32 into opening 64.

In some prior art designs, MEMS devices are subjected to a silicon gel coating process, and then the MEMS dice and associated integrated circuit dice are subsequently overmolded with a molding compound. The gel coating stress-isolates the MEMS devices from the molding compound. In such a configuration, the electrical interconnects between the MEMS dice and integrated circuit dice may thus pass through both of the silicon gel coating and a molding compound. Unfortunately, silicon gel coating adds to the material cost and packaging complexity of the MEMS chips. Moreover, the electrical interconnects are subject to stress and breakage at the interface between the gel coating and the molding compound. This problem is at least partially addressed in prior art designs by using larger diameter wires for the electrical interconnects. Of course, larger diameter wires can be more costly and can result in a larger overall MEMS die. The implementation of cap layer 34 and molding compound 32 eliminate the need for silicon gel coating in some embodiments and the commensurate need in some embodiments for the larger diameter wires, thereby simplifying fabrication and reducing material and fabrication costs.

Following encapsulation at task 168, a task 170 is performed. At task 170, plug element 164 is removed to yield MEMS chip 20 (FIG. 1). Packaging process 72 exits following task 170. MEMS chip 20 resulting from packaging process 72 therefore includes one or more MEMS devices 36 suspended on cantilevered substrate platform 46. Accordingly, MEMS devices 36 are less sensitive to variations in package stress. Additionally, the elements of MEMS chip 20 are packaged in an inexpensive overmolded package, i.e., encapsulated in molding compound 32, to provide environmental protection. However, the coupling of cap layer 34 over MEMS devices 36 protects them from particulate contamination, such as residue from panel separation. Furthermore, cap layer 34 protects the fragile movable parts of MEMS devices 36 so that molding compound 32 cannot come into contact with MEMS devices 36.

FIG. 15 shows a top view 172 and a side sectional view 174 of a MEMS chip 176 in accordance with another embodiment. Top view 172 of MEMS chip 176 is taken along section lines B-B of side sectional view 174. Likewise, side sectional view 174 is taken along section lines A-A of top view 172. Packaging process 72 may be adapted to produce MEMS chip 176. MEMS chip 176 includes an integrated circuit die 178 and a MEMS die 180 electrically coupled via interconnects 182. MEMS die 180 includes a MEMS device 184 surface micromachined on a first substrate 186 and protected by a cap layer 188. In this exemplary embodiment, first substrate 186 is not an SOI starting material, but instead may be a conventional silicon wafer upon which polysilicon and metal layers are surface micromachined to create MEMS device 184, the details of which are not shown. MEMS die 180 may further include a second substrate 190 attached to first substrate 186. First and second substrates 186 and 190, respectively, are formed in accordance with packaging process 72 (FIG. 3) to yield a stacked cantilevered platform structure 192 upon which MEMS devices 184 reside. Of course, in other embodiments, second substrate 190 may not be required. Regardless, this alternative embodiment achieves the benefits of improved package stress isolation and an inexpensive overmolded package.

Figure 16:
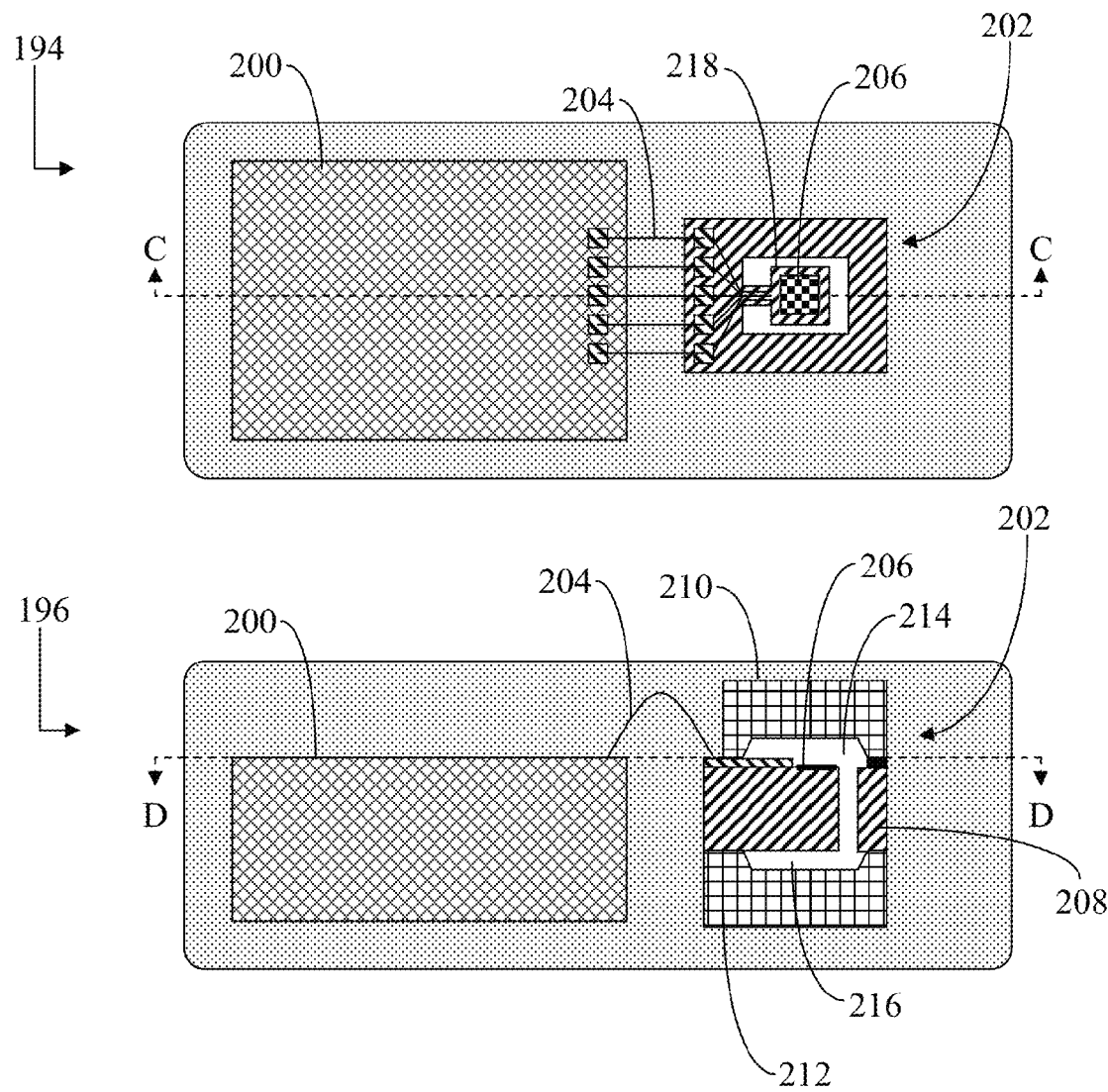
FIG. 16 shows a top view and a side sectional view of a MEMS chip in accordance with yet another embodiment.

FIG. 16 shows a top view 194 and a side sectional view 196 of a MEMS chip 198 in accordance with yet another embodiment. Top view 194 of MEMS chip 198 is taken along section lines D-D of side sectional view 196. Likewise, side sectional view 196 is taken along section lines C-C of top view 194. Packaging process 72 may also be adapted to produce MEMS chip 198. MEMS chip 198 includes an integrated circuit die 200 and a MEMS die 202 electrically coupled via interconnects 204. MEMS die 202 includes a MEMS device 206 surface micromachined on a substrate 208 and protected by a first cap layer 210 and second cap layer 212 to form a hermetically sealed package in which MEMS device 206 is housed. In an exemplary embodiment, MEMS device 206 may be an inertial sensor, such as an accelerometer. Such sensors may not require a port for exposure to an external environment. However, such sensors may call for a hermetically enclosed cavity design (in this embodiment using cap layers 210 and 212), to protect MEMS device 206 from particle contamination, moisture, and so forth. Cap layers 210 and 212 provide cavities 214 and 216, respectively, to achieve free space so that mechanical action of MEMS device 206 is allowed.

In this exemplary embodiment, substrate 208 may not be an SOI starting material depending upon the process flow, but instead may be a conventional silicon wafer upon which polysilicon and metal layers are surface micromachined to create MEMS device 206, the details of which are not shown. Substrate 208 is processed to form a cantilevered substrate platform 218 upon which MEMS device 206 resides. However, second cap layer 212 functions as a second substrate attached to substrate 208, but is fabricated to include cavities 216 underlying cantilevered substrate platform 218 of substrate 208. It is subsequently attached to substrate 208 in accordance with packaging process 72 (FIG. 3). Like the previously described embodiments, this alternative embodiment achieves the benefits of improved package stress isolation and an inexpensive overmolded package.

The previous embodiments generally include MEMS device assemblies having a cantilevered platform structure upon which a MEMS device resides. Packaging methodology entails capping the MEMS devices in a cap layer, wirebonding the MEMS devices with associated integrated circuit dice, and subsequently encapsulating the structure in a molding compound to form an overmolded package, e.g., a MEMS device assembly. In alternative embodiments, a simplified flow (described below) foregoes the cap layer which results in fewer processing steps, no seal region, no keep-away, no saw-to-reveal operations, and so forth while maintaining the cantilevered platform structure and its benefit of improved package stress isolation.

Figure 17:
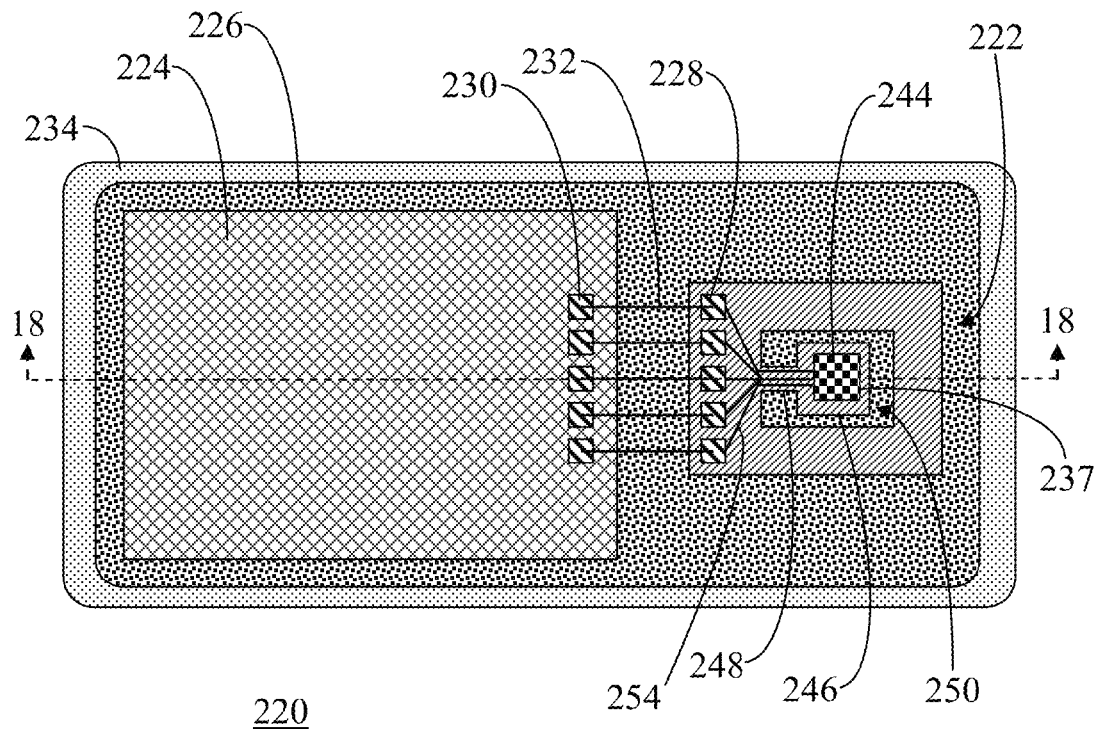
FIG. 17 shows a top view of a microelectromechanical systems (MEMS) chip in accordance with another embodiment.
Figure 18:
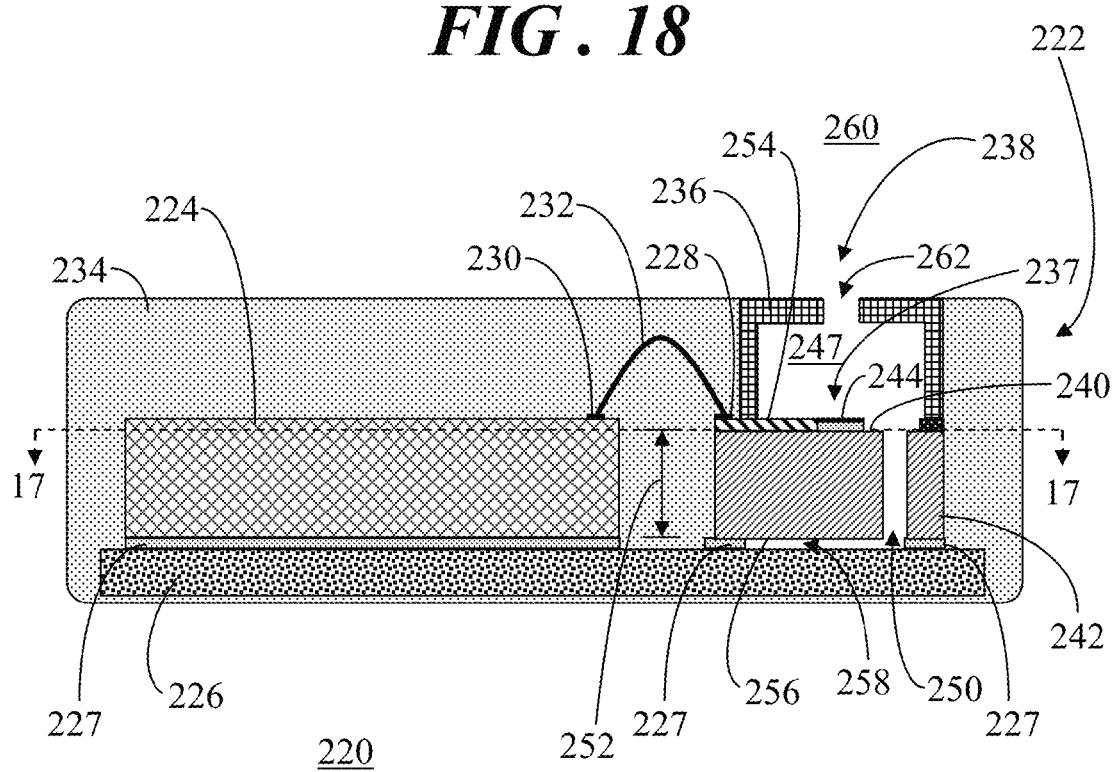
FIG. 18 shows a side sectional view of the MEMS chip of FIG. 17.

Referring now to FIGS. 17 and 18, FIG. 17 shows a top view of a microelectromechanical systems (MEMS) device assembly, referred to herein as a MEMS chip 220, in accordance with another embodiment, and FIG. 18 shows a side sectional view of MEMS chip 220. The top view of MEMS chip 220 shown in FIG. 17 is taken along section lines 17-17 of FIG. 18, and the side sectional view of MEMS chip 220 shown in FIG. 18 is taken along section lines 18-18 of FIG. 17. FIGS. 17-18 and subsequent figures are illustrated using various shading and/or hatching to distinguish different elements. These different elements within the structural layers may be produced utilizing current and upcoming micromachining techniques of depositing, patterning, etching, and so forth.

MEMS chip 220 is an assembly that includes at least a MEMS die 222 and an integrated circuit die 224 both of which are attached to a base structure, or substrate 226. For example, MEMS die 222 and integrated circuit die 224 may be attached to substrate 226 using a die attach material or adhesive 227. Bondwire pads 228 of MEMS die 222 are electrically interconnected with bondwire pads 230 of integrated circuit die 224 via interconnects 232 spanning between bondwire pads 228 and 230. MEMS die 222, integrated circuit die 224, bondwire pads 228, bondwire pads 230, and conductive interconnects 232 are overmolded with a molding compound 234.

MEMS die 222 is a MEMS package that includes a cap 236 overlying a MEMS device 237. Cap 236 is positioned in an opening 238 formed in molding compound 234 in accordance with a packaging process, discussed below, and overlies at least a portion of MEMS die 222. MEMS device 237 of MEMS die 222 is formed on, or alternatively in, a front side 240 of a die structure, or substrate 242. A material portion of substrate 242 is removed surrounding an active region 244 of MEMS device 237 to form a cantilevered substrate platform 246 at which active region 244 of MEMS device 237 resides. Thus, cap 236 includes an interior volume 247 which provides a gap, cavity, or air space, between cap 236 and active region 244.

Like previous embodiments, cantilevered substrate platform 246 includes an arm 248 extending from platform 246. One end of arm 248 is fixed to substrate 242, and the opposing end of arm 248 is fixed to substrate platform 246. Thus, once the material portion of substrate 242 is removed, an opening, referred to herein as a trench 250, extends through a substrate thickness 252 of substrate 242 and partially surrounds cantilevered substrate platform 246, with one end of arm 248 being the sole attachment point of cantilevered substrate platform 246 to the surrounding substrate 242. Accordingly, the underlying substrate 226 is visible through trench 250 in the top view of MEMS assembly 220 provided in FIG. 1. Conductive traces 254 may be formed on arm 248. Traces 254 electrically couple bondwire pads 228 with active region 244 of MEMS device 237 residing on cantilevered substrate platform 246. Although cantilever substrate platforms 246 and trenches 250 are shown as being generally rectangular in shape, it should be understood that they may alternatively be formed having differing shapes, rounded corners, and so forth.

In the following embodiments, substrate 242 may not be an SOI starting material, as shown in some of the previous embodiments. Instead, substrate 242 may be a conventional silicon wafer upon which polysilicon and metal layers deposited and etched to form MEMS device 237. Furthermore, substrate 242 may be a single wafer or a multiple stacked wafer configuration in accordance with a particular device design. It should be noted that MEMS device 237 (as well as previous embodiments) may be formed on substrate 242 using a surface micromachining process in which elements of MEMS device 237 are formed by deposition and etching of different structural layers on a top surface of substrate 242. Alternatively, MEMS device 237 (as well as previous embodiments) may be formed on substrate 242 using a bulk micromachining process in which elements of MEMS device 237 are formed by selectively etching into substrate 242.

A back side 256 of substrate 242, on which MEMS device 237 is formed, is attached to substrate 226. Attachment is performed such that a gap, or clearance space 258, is formed between cantilevered substrate platform 246 and the underlying substrate 226. In the illustrated embodiment, substrate 226 may be a generally planar wafer, leadframe, and the like. Attachment may be performed using adhesive 227 (e.g., epoxy, solder, and so forth) that is thick enough to ensure clearance, i.e., separation, between cantilevered substrate platform 246 and the underlying substrate 226 so as to provide suitable stress isolation for platform 246. Thus, cantilevered substrate platform 246 is suspended above the underlying substrate 226.

In an embodiment, MEMS die 222 may be configured to sense a pressure stimulus from an environment 260 external to MEMS chip 220. Accordingly, cap 236 may be provided with a port 262 extending through cap 236. As such, active region 244 can be exposed to external environment 260 via port 262. In an exemplary embodiment, MEMS die 222 may be a piezoresistive type pressure sensor. Piezoresistive pressure sensors sense external pressure by means of a piezoresistance effect of a silicon diaphragm as the pressure detecting device. For example, piezoresistive materials (not shown) may be deposited on, diffused into, or otherwise formed on or into front side 240 of substrate 242 at active region 244, which serves as a movable diaphragm (see, for example, FIGS. 30 and 31). The piezoresistive elements are typically realized as diffused resistors, and these diffusion resistors are typically connected into a bridge circuit. The pressure signal can determined from the bridge circuit in accordance with changes in the resistance values of the diffusion resistors which are caused by displacement of the diaphragm, e.g. active region 244.

Like MEMS device 36 (FIG. 1) discussed above, MEMS device 237 represents a variety of one or more MEMS components of MEMS chip 220, such as microswitches and/or microsensors. Microsensors include, for example, pressure sensors, accelerometers, gyroscopes, microphones, micro fluidic devices, and so forth. Accordingly, MEMS active region 244 represents any sensing, or movable, element or elements of a particular MEMS component. Integrated circuit die 224 represents the central unit, e.g., a microprocessor, that processes data from MEMS die 222. Thus, integrated circuit die 224 provides "intelligence" built into MEMS chip 220. Although MEMS chip 220 is shown as including only one MEMS die 222 and one integrated circuit die 224, it should be understood that MEMS chip 220 can include any number of MEMS dice 222 and integrated circuit dice 224 in accordance with particular design requirements for MEMS chip 220.

Figure 19:
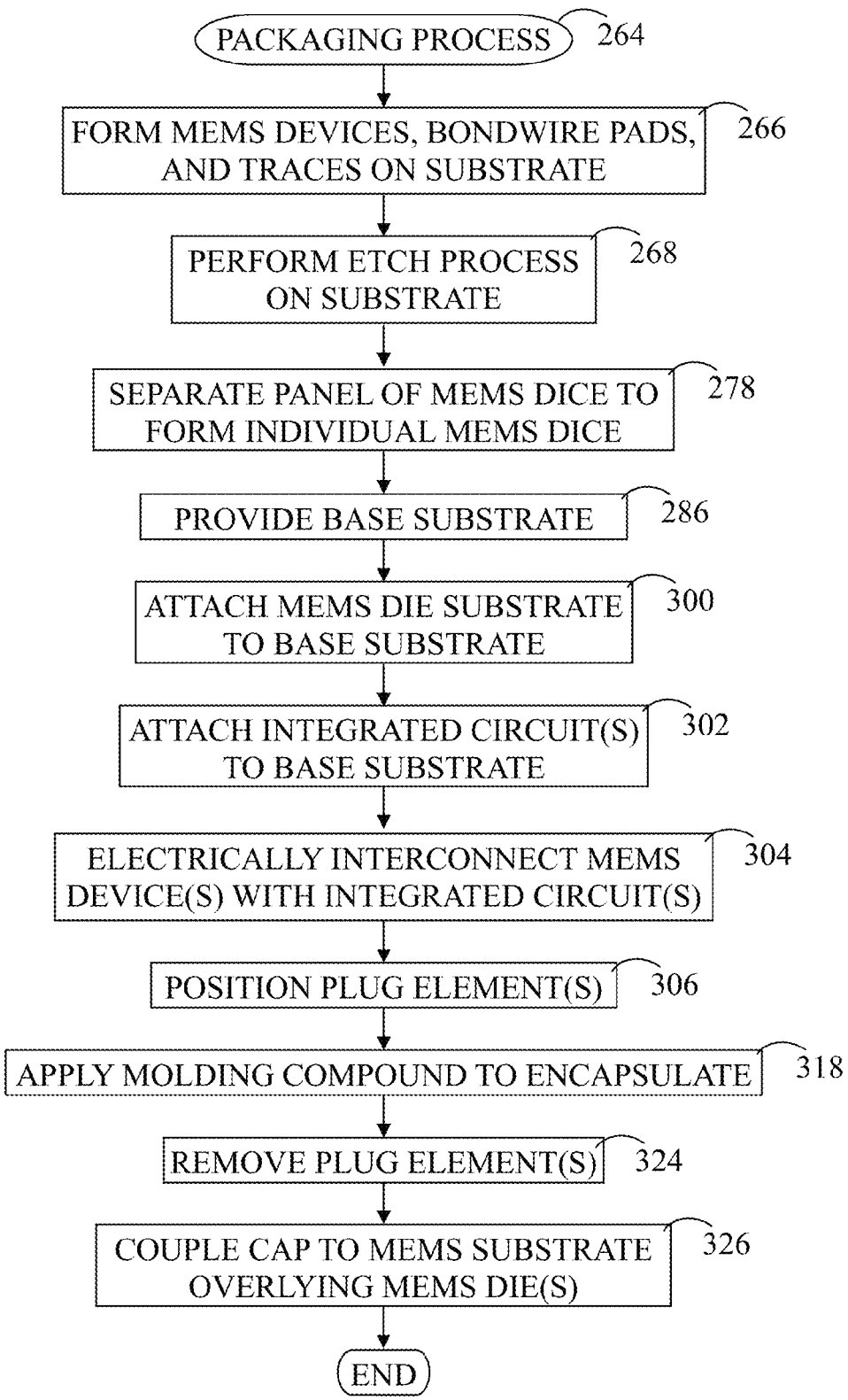
FIG. 19 shows a flowchart of a packaging process for producing and packaging the MEMS chip of FIGS. 17 and 18.

FIG. 19 shows a flowchart of a packaging process 264 for producing and packaging the MEMS chip 220 (FIGS. 17 and 18). Process 264 implements known and developing MEMS micromachining technologies to cost effectively yield MEMS chip 220 that includes at least one MEMS die 222 having improved package stress isolation. Process 264 is described below in connection with the fabrication and packaging of only a few MEMS dice 222 and a few MEMS chips 220. However, it should be understood by those skilled in the art that the following process allows for concurrent wafer-level manufacturing of a plurality of MEMS dice 222. These individual MEMS dice 222 can subsequently be packaged and integrated into an end application that includes integrated circuit die 224.

MEMS chip packaging process 264 begins with a task 266. At task 266, fabrication processes related to the formation of MEMS devices 237, bondwire pads 228, and conductive traces 254 on substrate 242 are performed. These fabrication processes are discussed above in connection with FIG. 4. However, other fabrication activities and/or alternative fabrication processes may be performed per convention that are not discussed or illustrated herein for brevity.

Packaging process 264 continues with a task 268. At task 268, one or more etch processes are performed on substrate 242.

Figure 20:
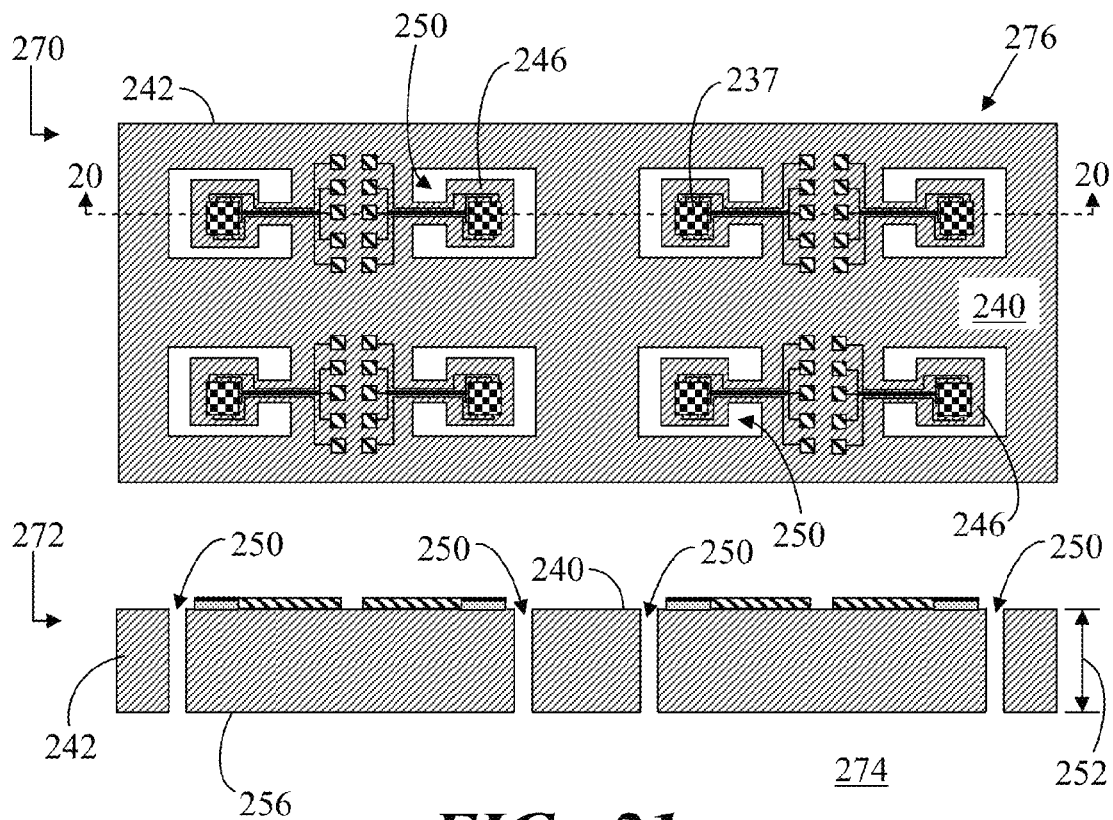
FIG. 20 shows a top view and a side sectional view of a partial MEMS wafer at an intermediate stage of processing in accordance with the packaging process of FIG. 19.

Referring to FIG. 20 in connection with task 268, FIG. 20 shows a top view 270 and a side sectional view 272 of a partial MEMS wafer at an intermediate stage of processing 274 in accordance with task 268 of packing process 264. Side sectional view 272 is taken along section lines 20-20 of top view 270 in FIG. 20.

Task 268 relates to one or more etch processes performed from, for example, front side 240 of substrate 242 toward back side 256 of substrate 242. As discussed above in connection with FIGS. 5-7, a mask or suitable deposition of a resist material may be used to cover or otherwise protect those regions of substrate 242 that are not to be etched. As such, the mask or resist material provides a pattern for forming trenches 250 extending through substrate 242 and for producing cantilevered substrate platforms 246. A deep reactive-ion etching (DRIE) process may be performed to penetrate through the entire substrate thickness 252 of substrate 242. In other embodiments, another suitable etch technique or techniques may be implemented to penetrate through the entire substrate thickness 252 to form trenches 250. Through execution of the aforementioned tasks, a wafer, or panel 276, of MEMS devices 237 is produced.

With reference back to FIG. 19, following task 268, packaging process 264 continues with a task 278. At task 278, panel 276 (FIG. 20) is separated to form individual MEMS dice 222, each including at least one MEMS device 237.

Figure 21:
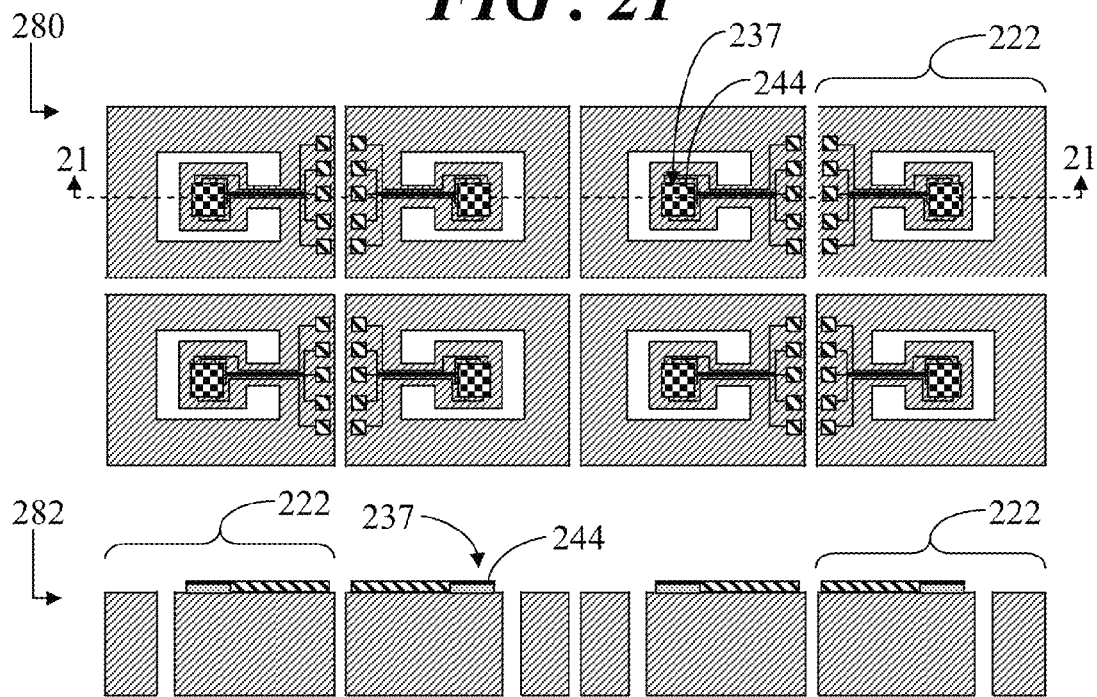
FIG. 21 shows a top view and a side sectional view of the structure of FIG. 20 at a subsequent stage of processing.

Referring to FIG. 21 in connection with task 278, FIG. 21 shows a top view 280 and a side sectional view 282 of the structure of FIG. 20 at a subsequent stage of processing 284. Side sectional view 282 is taken along section lines 21-21 of top view 280 in FIG. 21. FIG. 21 represents the outcome of a panel separation process performed at task 278. As shown, panel 276 (FIG. 20) has been sawn, diced, or otherwise separated to form individual MEMS dice 222, each of which includes at least one MEMS device 237. In contrast to embodiments described above, panel separation process of task 278 is executed without first performing operations such as coupling a cap layer to the panel, saw to reveal bondwire pads, and so forth. Furthermore, cap 236 (FIG. 18) has not yet been installed overlying active region 244 of each MEMS device 237.

With reference back to FIG. 19, following task 278, packaging process 264 continues with a task 286. At task 286, a base substrate is provided. In an embodiment, the base substrate may be base substrate 226 (FIG. 18) in the form of a generally planar wafer, leadframe, and the like. However, base substrate 226 need not have the planar construct of substrate 226.

Referring to FIGS. 22 and 23 in connection with task 286, FIG. 22 shows a top view 288 and a side sectional view 290 of a base substrate 292 in accordance with an alternative embodiment. Side sectional view 290 is taken along section lines 22-22 of top view 288 in FIG. 22. FIG. 23 shows a side view of a base substrate 294 in accordance with another embodiment.

In the embodiment of FIG. 22, base substrate 292 includes a cutout 296 extending through an entire thickness of base substrate 292. Once assembled, cutout 296 underlies cantilevered platform structure 246 (FIG. 17) to produce some or all of clearance space 258 (FIG. 18) between cantilevered platform structure 246 and base substrate 292. Additionally, cutout 296 can function as a port for exposing MEMS device 237 (FIG. 18) to external environment 260 (FIG. 18). For example, cutout 296 may be contiguous, or approximately aligned, with trench 250 so that MEMS device 237 is exposed to environment 260 via cutout 296 and trench 250.

In the embodiment of FIG. 23, base substrate 294 includes a cutout 298 extending partially through the thickness of base substrate 294. Thus, once assembled cutout 298 underlies cantilevered platform structure 246 to produce clearance space 258 between cantilevered platform structure 246 and base substrate 294. However, since cutout 298 only partially extends through the thickness of base substrate 294, MEMS device 237 is not exposed to environment 260 via cutout 298. Cutout 296 (FIG. 22) and cutout 298 may be suitably configured in various shapes and sizes. Alternatively, a base substrate may include a cutout extending partially through the thickness of the base substrate, as well as a smaller port extending through the thickness of the base substrate in this cutout region.

With reference back to FIG. 19, packaging process 264 continues with a task 300. At task 300, the MEMS die 222 (FIG. 17) is attached to the base substrate. In the example of FIGS. 17-18, MEMS die 222 may be attached to base substrate 226 using adhesive 227, e.g., epoxy, solder, and so forth (FIG. 18). In alternative embodiments, MEMS die 222 may be attached to base substrate 292 (FIG. 22) or base substrate 294 in accordance with known and upcoming techniques.

Packaging process 264 continues with a task 302. At task 302, integrated circuit die 224 (FIG. 17) or dies 224 is attached to base substrate 226. Again, integrated circuit die 224 may be attached to base substrate 226 using any suitable die attach material and suitable bonding technique.

Following the attachment operations 300 and 302, packaging process 264 continues with a task 304. At task 304, each MEMS die 222 (FIG. 17) is electrically interconnected with its integrated circuit die 224 (FIG. 17) via conductive interconnects 232 (FIG. 17). For example, a wirebonding process may be performed to form external connections between bondwire pads 228 (FIG. 17) of MEMS die 222 and bondwire pads 230 (FIG. 17) of integrated circuit die 224 using conductive interconnects 232.

Next, a task 306 is performed. At task 162, a plug element is positioned overlying MEMS device 237 (FIG. 17) of MEMS die 222.

Figure 24:
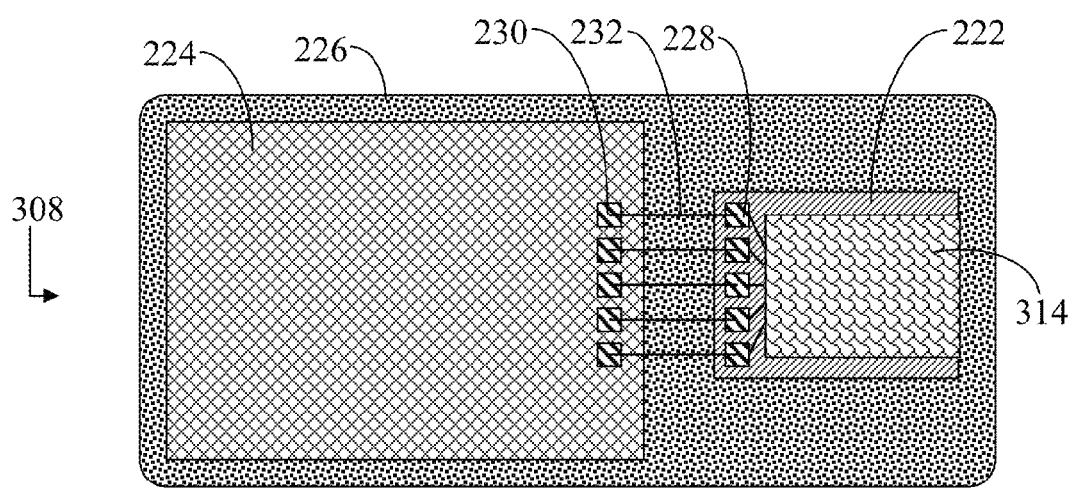
FIG. 24 shows a top view and a side sectional view of the structure of FIG. 21 at a subsequent stage of processing.

Referring to FIG. 24, FIG. 24 shows a top view 308 and a side sectional view 310 of the structure of FIG. 21 at a subsequent stage of processing 312. As shown, a plug element 314 is positioned overlying MEMS device 237 of MEMS chip 222. However, integrated circuit 224, bondpads 228, bondpads 230, and bondwires 232 remain exposed from plug element 314. Plug element 314 may be a conventional molding pin having a depressed area 316 so that an inner surface of plug element 314 avoids contact with cantilevered platform structure 246 and MEMS device 237.

With reference back to FIG. 19, following task 306, a task 318 is performed. At task 318, molding compound 234 is applied to MEMS die 222 with its attached integrated circuit die 224.

Figure 25:
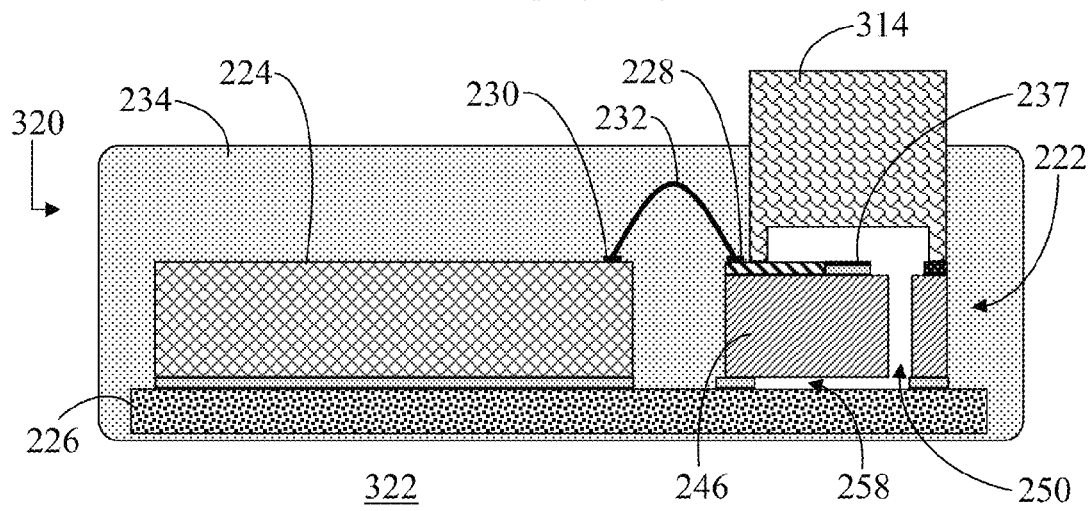
FIG. 25 shows a side sectional view of the structure of FIG. 24 at a subsequent stage of processing.

Referring to FIG. 25 in connection with task 318, FIG. 25 shows a side sectional view 320 of the structure of FIG. 24 at a subsequent stage of processing 322. Molding compound 234 encapsulates base substrate 226, MEMS die 222, integrated circuit die 224, bondwire pads 228 and 230, conductive interconnects 232, and plug element 314. However, plug element 314 is sufficiently high so that a portion of plug element 314 extends beyond the thickness of molding compound 234. Plug element 314 overlying MEMS device 237 prevents molding compound 234 from direct contact with MEMS device 237. In addition, plug element 314 (FIG. 14) prevents a flow of molding compound 234 into trench 250 surrounding cantilevered platform structure 246 and into clearance space 258.

With reference back to FIG. 19, following encapsulation task 318, packaging process 264 continues with a task 324. At task 324, plug element 314 (FIG. 24) is removed so that opening 238 (FIG. 17) at least temporarily remains in its place overlying MEMS device 222.

Next, a task 326 is performed. At task 326, a cap, such as cap 236 shown in FIG. 17 is positioned in opening 238. Cap 236 is molded in place, or otherwise coupled to, substrate 242 (FIG. 17) of MEMS device 222 with, for example, an adhesive or epoxy material. Following task 326, packaging process 264 exits. The simplified flow of package process packaging process 264 can achieve savings in process operations, as well as savings in overall size, since there is no bonding of a cap layer to the panel, no saw to reveal process for exposing bondwire pads, no need for keep away regions at which microstructures cannot be located, and so forth.

Figure 26:
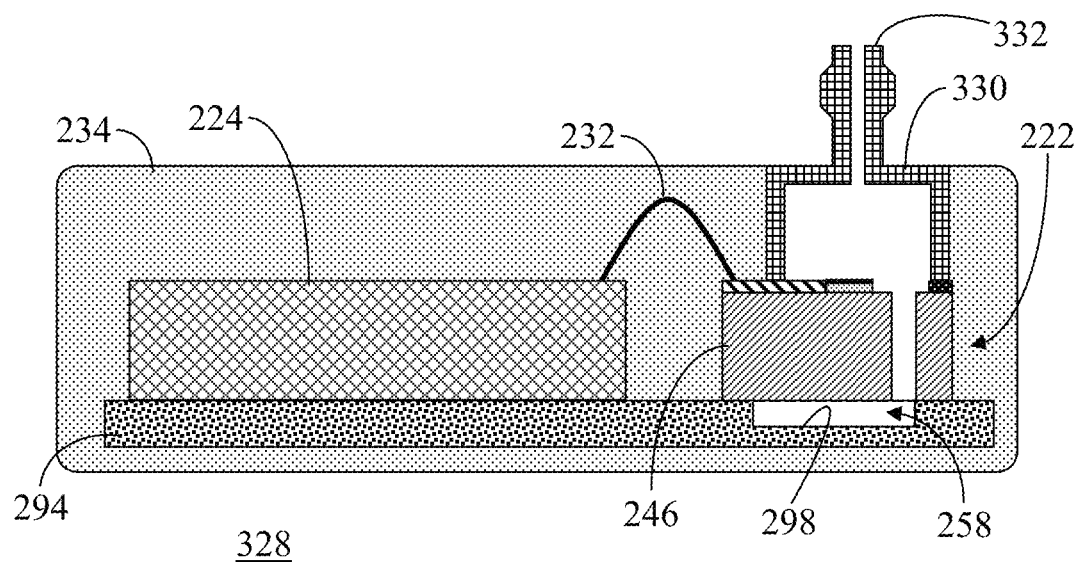
FIG. 26 shows a side sectional view of a microelectromechanical systems (MEMS) chip in accordance with another embodiment.

FIG. 26 shows a side sectional view of a microelectromechanical systems (MEMS) 328 chip in accordance with another embodiment. Like MEMS chip 220 (FIG. 17), MEMS chip 328 includes MEMS die 222 and integrated circuit die 224 electrically interconnected via conductive interconnects 232. In the illustrated embodiment, MEMS die 222 and integrated circuit die 224 are attached to base substrate 294 with cutout 298 underlying cantilevered substrate platform 246 so that clearance space 258 is formed between platform 246 and base substrate 294.

In addition, MEMS chip 328 includes a cap 330 in lieu of cap 236 (FIG. 18) of MEMS chip 220. Cap 330 includes an axial port 332 that may be utilized for a hose connection. Such a configuration of MEMS chip 328 may be implemented as, for example, a manifold absolute pressure sensor. Like MEMS chip 220, the elements of MEMS chip 328 are encapsulated in molding compound 234, and MEMS chip 328 is packaged in accordance with packaging process 264 (FIG. 19).

Figure 27:
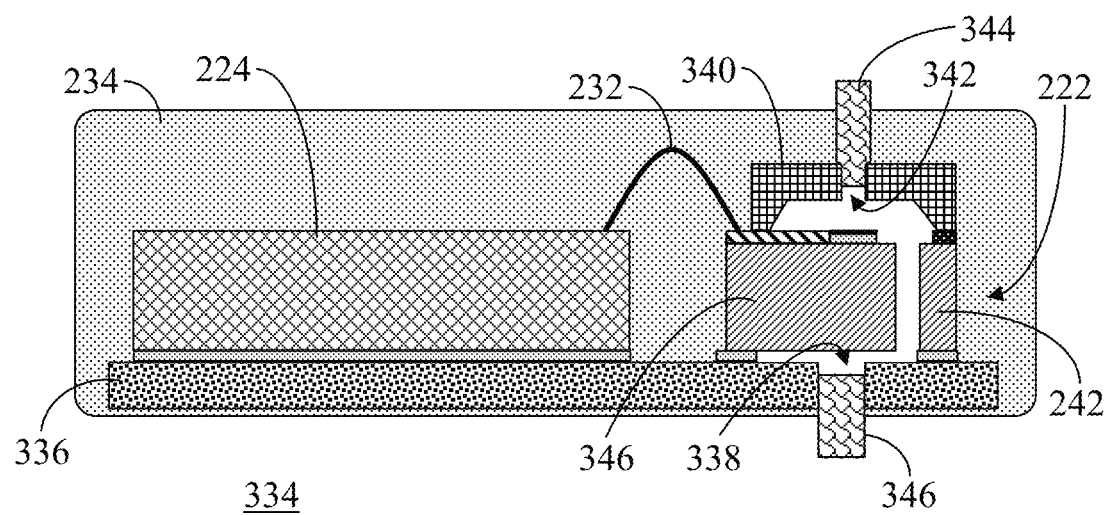
FIG. 27 shows a side sectional view of another microelectromechanical systems (MEMS) chip at an intermediate stage of processing in accordance with another embodiment.
Figure 28:
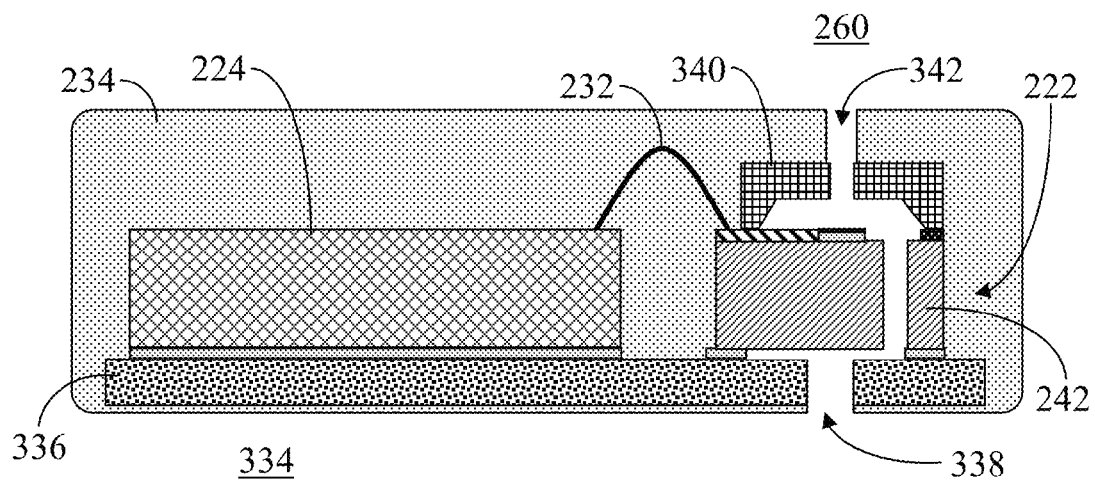
FIG. 28 shows a side sectional view of the microelectromechanical systems (MEMS) chip of FIG. 27.

Referring to FIGS. 27-28, FIG. 27 shows a side sectional view of another microelectromechanical systems (MEMS) chip 334 at an intermediate stage of processing in accordance with another embodiment, and FIG. 28 shows a side sectional view of microelectromechanical systems (MEMS) chip 334 following an overmolding operation MEMS chip 334 includes MEMS die 222 and integrated circuit die 224 electrically interconnected via conductive interconnects 232. In the illustrated embodiment, MEMS die 222 and integrated circuit die 224 are attached to a base substrate 336 with a cutout 338 underlying cantilevered substrate platform 246 and extending entirely through base substrate 336.

In addition, MEMS chip 334 includes a cap 340 in lieu of previously described caps 236 (FIG. 18) and 330 (FIG. 26). An opening 342 extends through cap 340. In this illustrated embodiment, cap 340 is positioned on substrate 242 of MEMS device 222 prior to overmolding. A plug element 344, or molding pin, positioned in opening 342 holds cap 340 in place and plugs opening 342. Another plug element 346 plugs cutout 338 in base substrate 336. After plug elements 344 and 346 are appropriately positioned, the elements of MEMS chip 334 are encapsulated in molding compound 234. Following the overmolding operation, plug elements 344 and 346 are removed so that MEMS device 237 is exposed to external environment 260. In an actual implementation in which MEMS chip 334 is mounted to, for example, a printed circuit board (PCB), the PCB may include an opening corresponding to cutout 338.

Figure 29:
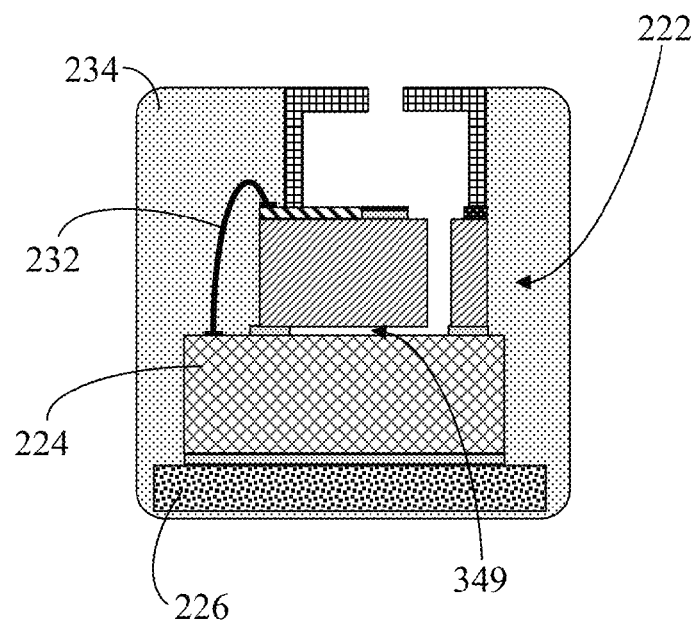
FIG. 29 shows a side sectional view of a microelectromechanical systems (MEMS) chip in accordance with yet another embodiment.

FIG. 29 shows a side sectional view of a microelectromechanical systems (MEMS) chip 347 in accordance with yet another embodiment. Like MEMS chip 220 (FIG. 17), MEMS chip 347 includes MEMS die 222 and integrated circuit die 224 electrically interconnected via conductive interconnects 232. The illustrated embodiment shows a configuration in which MEMS die 222 is vertically stacked with integrated circuit die 224. More specifically, back side 256 of MEMs die 222 coupled to using, for example, a die attach material having a thickness sufficient to ensure that a clearance space 349 is formed between cantilevered substrate platform 246 and integrated circuit die 224. Accordingly, integrated circuit die 224 serves the substrate upon which MEMS die 222 is attached.

MEMS chip 220 (FIG. 18), MEMS chip 328 (FIG. 26), and MEMS chip 334 (FIG. 28), and MEMS chip 347 provide illustrative examples of various MEMS chip configurations. In various embodiments, a MEMS chip may be ported from the top via its cap, from the bottom via the base substrate, or a MEMS chip may be ported from both the top and the bottom.

Figure 30:
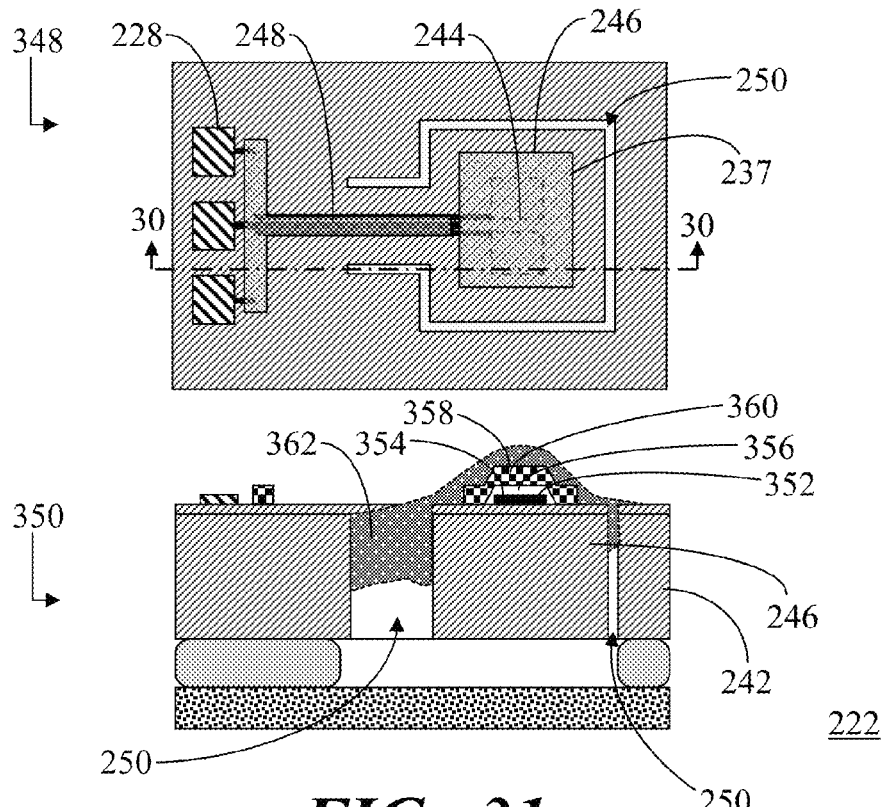
FIG. 30 shows a top view and a side sectional view of a microelectromechanical systems (MEMS) device.

FIG. 30 shows a top view 348 and a side sectional view 350 of microelectromechanical systems (MEMS) die 222. Side sectional view 350 is taken along section lines 30-309 of top view 348 in FIG. 30. In the illustrated embodiment, MEMS die 222 may be formed by a surface micromachining process in which, for example, a structural layer 352 is formed on substrate 242 and suitably processed to include at least one electrode 354. A sacrificial layer 356 (denoted by an absence of shading or hatch marks) is formed on structural layer 350, and a movable element 358 is formed in another structural layer 360 deposited on sacrificial layer 356. Sacrificial layer 356 is subsequently removed such that movable element 358 is spaced apart from electrode 354. Deposition, patterning, and etching operations may be performed to produce the structure of MEMS die 222 in accordance with known and upcoming methodologies and materials.

In some embodiments, MEMS die 222 may be a pressure sensor configured to sense pressure in environment 260 (FIG. 18) external to MEMS chip 220 (FIG. 18). Thus, MEMS die 222 may be ported from the top via its cap 236 (FIG. 18) as discussed above so that movable element 358 of MEMS device 237 deflects in response to the fluid pressure within environment 260. MEMS device 237 (e.g., at least electrode 354 and movable element 358) resides on cantilevered substrate platform 246 also as discussed in detail above. Platform 246 is separated from the remainder of substrate 242 by trench 250, i.e., a trench, surrounding platform 246.

Since MEMS die 222 is ported via cap 236 to environment 260, MEMS device 237 is thus exposed to environment 260. In order to be viable, MEMS device 237 should be robust in 'dirty' environments. That is, the function of MEMS device 237 should not be adversely affected by particles or other contaminants in environment 260. Such particles can get into trench 250 surrounding platform 246 and bridge the gap between platform 246 and substrate 242, thus compromising the stress isolation resulting from implementation of cantilevered substrate platform. That is, stress may be transmitted from substrate 242 to platform 246 via particles in trench 250.

Accordingly, in some embodiments, a gel material 362 (illustrated in side sectional view 350) may be applied over MEMS device 237 and trench 250. That is, MEMS device 237 can be subjected to a silicon gel coating process that covers movable element 358 and fills at least a portion of trench 250 with gel material 362. Such an approach can largely prevent particulate matter from getting into trench 250 while concurrently enabling movable element 358 to move in response to fluid pressure. Gel material 362 may be suitably applied prior to coupling cap 236 (FIG. 18) to substrate 242 of MEMS device 222, or following coupling of cap 236 by injection of gel material 362 through port 262 (FIG. 18) of cap 236.

Figure 31:
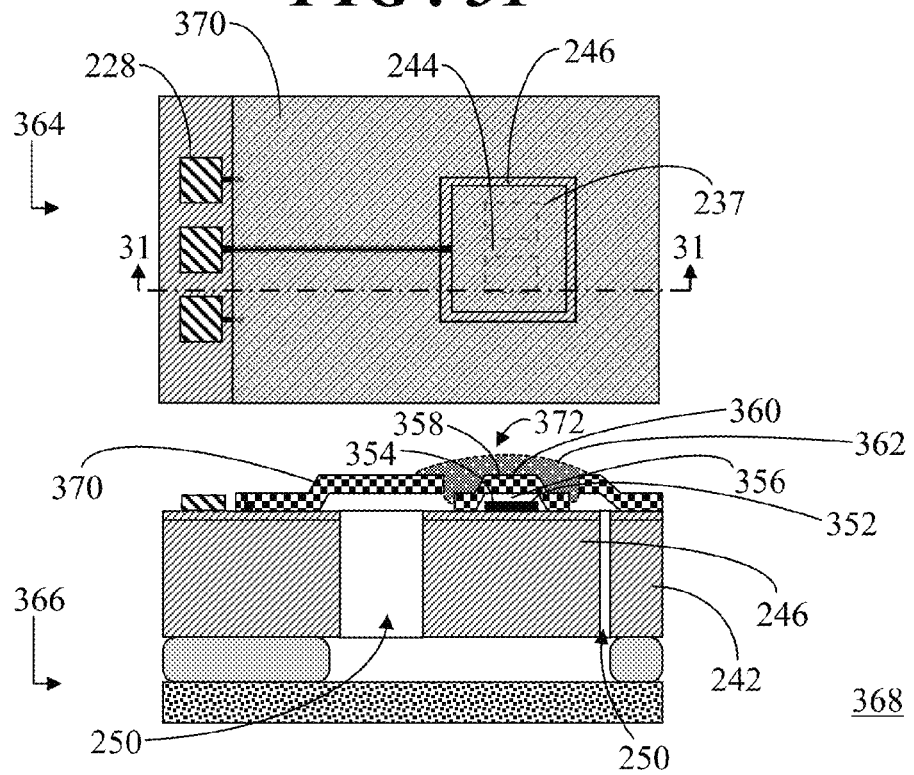
FIG. 31 shows a top view and a side sectional view of a microelectromechanical systems (MEMS) device in accordance with another embodiment.

FIG. 31 shows a top view 364 and a side sectional view 366 of a microelectromechanical systems (MEMS) die 368 in accordance with another embodiment. Side sectional view 366 is taken along section lines 31-31 of top view 364 in FIG. 31. MEMS die 368 may be formed by a surface micromachining process in which, for example, structural layer 352 is formed on substrate 242 and suitably processed to include at least one electrode 354. Sacrificial layer 356 (denoted by an absence of shading or hatch marks) is subsequently formed on structural layer 352. In this illustrated embodiment, movable element 358 and a shield structure 370 are formed in structural layer 360 deposited on sacrificial layer 356.

Shield structure 370 is suitably formed to overlie trench 250 surrounding cantilevered substrate platform 246. However, an opening 372 extends through shield structure 370 so that the active region, i.e., movable element 358, is exposed to environment 260 (FIG. 18) via opening 372. Sacrificial layer 356 is subsequently removed such that movable element 358 is spaced apart from electrode 354 and shield structure 370 is vertically spaced apart from trench 250. Deposition, patterning, and etching operations may be performed to produce the structure of MEMS device 368 in accordance with known and upcoming methodologies and materials.

Gel material 362 (illustrated in side sectional view 366) may be applied over MEMS device 237 and shield structure 370. That is, MEMS device 237 can be subjected to a silicon gel coating process that covers movable element 358 and fills a gap between movable element and shield structure 370. Such an approach can largely prevent particulate matter from getting into trench 250 while concurrently enabling movable element 358 to move in response to fluid pressure. Moreover, implementation of shield structure 370 calls for the use of less gel material 362 and simplified application of gel material 362.

Embodiments described herein comprise compact MEMS device assemblies, i.e., MEMS chips, that include one or more integrated circuit dice and one or more MEMS dice. A MEMS die includes a cantilevered platform structure upon which a MEMS device resides. This cantilevered platform structure achieves the benefit of improved package stress isolation. Packaging methodology entails forming the cantilevered platform structures in a substrate, capping the MEMS devices in a cap layer, wirebonding the MEMS dice with associated integrated circuit dice, and subsequently encapsulating the structure in a molding compound to form an overmolded package, e.g., MEMS chip. Alternatively, packaging methodology entails forming the cantilevered platform structures in a substrate, wirebonding the MEMS dice with associated integrated circuit dice, temporarily shielding the MEMS dice, encapsulating the structure in a molding compound to form an overmolded MEMS chip package, removing the shield, and subsequently capping the MEMS dice. The methods described herein can be adapted for packaging a variety of MEMS device assemblies. Accordingly, the MEMS device assemblies and packaging methodology achieve the advantages of good device performance, small device size, inexpensive overmolded packaging, and adaptation to a variety of MEMS packaging needs.

Although the preferred embodiments of the invention have been illustrated and described in detail, it will be readily apparent to those skilled in the art that various modifications may be made therein without departing from the spirit of the invention or from the scope of the appended claims. That is, it should be appreciated that the exemplary embodiments are only examples, and are not intended to limit the scope, applicability, or configuration of the invention.

What is claimed is:

1. A method of making a microelectromechanical systems (MEMS) device package comprising:
   forming a MEMS device on a front side of a first substrate;
   removing a portion of said substrate partially surrounding an active region of said MEMS device to form a cantilevered substrate platform at which said active region resides;
   attaching a back side of said first substrate to a second substrate, said attaching operation including forming a clearance space between said cantilevered substrate platform and said second substrate so that said cantilevered substrate platform is suspended above said second substrate;
   positioning a plug member overlying said cantilevered substrate platform;
   following said attaching and positioning operations, applying a molding compound to encapsulate said MEMS device; and
   following said applying operation, removing said plug member and coupling a cap to said first substrate overlying said cantilevered substrate platform, said cap including an interior volume to provide a gap between said cap and said active region of said MEMS device.

2. A method as claimed in claim 1 wherein said forming said clearance space comprises producing a cutout in said second substrate underlying said cantilevered substrate platform.

3. A method as claimed in claim 1 wherein said second substrate is an integrated circuit die, said attaching operation couples said MEMS device with said integrated circuit die such that said MEMS device is vertically stacked with said integrated circuit die and said clearance space is formed between said cantilevered substrate platform and said integrated circuit die.

4. A method as claimed in claim 1 wherein:
   said forming operation includes forming bondwire pads on said first substrate, said bondwire pads being electrically coupled with said MEMS device via traces;
   said method further includes electrically interconnecting said bondwire pads with an integrated circuit die via conductive interconnects; and
   said applying operation concurrently encapsulates said integrated circuit die, said conductive interconnects, said bondwire pads, and said MEMS device with said molding compound.

5. A method as claimed in claim 1 further comprising providing a port extending through said cap so that said active region is exposed to an external environment via said port.

6. A method of making a microelectromechanical systems (MEMS) device package comprising:
   forming a MEMS device and bondwire pads on a first substrate, said bondwire pads being electrically coupled with said MEMS device via traces;
   removing a portion of said first substrate partially surrounding an active region of said MEMS device to form a cantilevered substrate platform at which said active region resides;
   attaching a back side of said first substrate to a second substrate, said attaching operation including forming a clearance space between said cantilevered substrate platform and said second substrate so that said cantilevered substrate platform is suspended above said second substrate;
   electrically interconnecting said bondwire pads with an integrated circuit die via conductive interconnects;
   positioning a plug member overlying said cantilevered substrate platform;
   following said positioning, applying a molding compound to encapsulate said integrated circuit die, said conductive interconnects, said bondwire pads, and said MEMS device; and
   following said applying operation, removing said plug member and coupling a cap to said first substrate overlying said cantilevered substrate platform, said cap including an interior volume to provide a gap between said cap and said active region of said MEMS device.

* * * * *